(12) United States Patent
Banna et al.

(10) Patent No.: US 10,388,691 B2
(45) Date of Patent: Aug. 20, 2019

(54) LIGHT EMITTING DIODES (LEDS) WITH STACKED MULTI-COLOR PIXELS FOR DISPLAYS

(71) Applicant: GLOBALFOUNDRIES Inc., Grand Cayman (KY)

(72) Inventors: Srinivasa Banna, San Jose, CA (US); Deepak Nayak, Union City, CA (US); Ajey P. Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 10 days.

(21) Appl. No.: 15/599,427

(22) Filed: May 18, 2017

(65) Prior Publication Data

US 2017/0338275 A1 Nov. 23, 2017

Related U.S. Application Data

(60) Provisional application No. 62/337,900, filed on May 18, 2016, provisional application No. 62/337,902, filed on May 18, 2016, provisional application No. 62/337,899, filed on May 18, 2016.

(51) Int. Cl.
  *H01L 27/15* (2006.01)
  *H01L 33/06* (2010.01)
  *H01L 33/32* (2010.01)
  *H01L 33/24* (2010.01)

(52) U.S. Cl.
  CPC ............ *H01L 27/156* (2013.01); *H01L 33/06* (2013.01); *H01L 27/15* (2013.01); *H01L 33/24* (2013.01); *H01L 33/32* (2013.01); *H01L 2933/0016* (2013.01)

(58) Field of Classification Search
  None
  See application file for complete search history.

(56) References Cited

U.S. PATENT DOCUMENTS

| | | |
|---|---|---|
| 6,627,552 B1 | 9/2003 | Nishio et al. |
| 7,582,498 B2 | 9/2009 | D'Evelyn et al. |
| 8,163,581 B1 | 4/2012 | Or-Bach et al. |
| 8,241,932 B1 | 8/2012 | Yu et al. |
| 9,941,329 B2 | 4/2018 | Nayak et al. |
| 2006/0038188 A1 | 2/2006 | Erchak et al. |
| 2006/0049415 A1 | 3/2006 | Liao et al. |

(Continued)

OTHER PUBLICATIONS

Furukawa,Yuzo,Hiroo Yonezu, and Akihiro Wakahara. "Monolithic integration of light-emitting devices and silicon transistors." SPIE, Newsroom, Nov. 19, 2007, DOI:10.1117/2.1200711.0914,Toyohashi, Japan.

(Continued)

*Primary Examiner* — Anthony Ho
*Assistant Examiner* — Kevin Quinto
(74) *Attorney, Agent, or Firm* — Thompson Hine LLP; Anthony Canale

(57) ABSTRACT

A color stacked light emitting diode (LED) pixel is disclosed. The color stacked LED includes an LED pixel structure body, a base LED disposed on at least a portion of the LED pixel structure body, an intermediate LED disposed on the base LED, and a top LED disposed on the intermediate LED. The stacked LED may be an overlapping or a non-overlapping LED pixel. The LED pixel structure body may be a fin body or a nanowire body.

16 Claims, 25 Drawing Sheets

(56) References Cited

U.S. PATENT DOCUMENTS

| | | | |
|---|---|---|---|
| 2009/0140274 A1 | 6/2009 | Wierer, Jr. et al. | |
| 2010/0006873 A1* | 1/2010 | Raring | H01L 27/153 257/90 |
| 2010/0081218 A1 | 4/2010 | Hardin | |
| 2012/0025232 A1* | 2/2012 | Gwo | H01L 33/007 257/94 |
| 2014/0191249 A1 | 7/2014 | Blanchard et al. | |
| 2014/0206117 A1 | 7/2014 | Sonoda et al. | |
| 2014/0368772 A1 | 12/2014 | Hwang et al. | |
| 2014/0374742 A1 | 12/2014 | Tsang | |
| 2015/0295013 A1 | 10/2015 | Matsumoto et al. | |
| 2016/0093665 A1 | 3/2016 | Schubert et al. | |
| 2016/0095221 A1 | 3/2016 | Ramachandran et al. | |
| 2016/0164033 A1 | 6/2016 | Moon et al. | |
| 2017/0148756 A1 | 5/2017 | Yu et al. | |

OTHER PUBLICATIONS

Vincent Lee, High Brightness Microdisplays by Monolithic Integration of III-V LEDs and Thin Film Silicon Transistors (slides), International Display Workshop, Dec. 4, 2014, Slides 7 &15, Niigata, Japan.

J. W. Chung, K. Ryu, B. Lu and T. Palacios, "GaN-on-Si technology, a new approach for advanced devices in energy and communications," 2010 Proceedings of the European Solid State Device Research Conference, Sevilla, 2010, pp. 52-56, Massachusetts Institute of Technology, Cambridge, USA.

T. Mak, Z. Liu, W. Chong, Y. Gao, X. Fang, J. Sin, P. Mok, and K. Lau, "Integration Scheme toward LED System-on-a-Chip (SoC)," in Light, Energy and the Environment, OSA Technical Digest (online) (Optical Society of America, 2014), paper DTu3D.4.

Dong, Wang, Huang, Zhang, Guan and Chen, "A 630dpi dynamic LED display array in standard Si-based CMOS technology.",Received Mar. 10, 2011; accepted Sep. 20, 2011; published online Apr. 12, 2012, State Key Laboratory of Integrated Optoelectronics, Institute of Semiconductors, Chinese Academy of Science, Beijing 10083 China.

M. Volpert et al., "A Wafer Level approach for led packaging using TSV last technology," 2015 IEEE 65th Electronic Components and Technology Conference (ECTC), San Diego, CA, 2015, pp. 1102-1108. doi: 10.1109/ECTC.2015.7159732 URL: http://ieeexplore.ieee.org/stamp/stamp.jsp?tp=&arnumber=7159732&isnumber=7159553.

Renjie Wang, Hieu P. T. Nguyen, Ashfiqua T. Connie, J. Lee, Ishiangs Shih, and Zetian MI, "Color-tunable, phosphor-free InGaN nanowire light-emitting diode arrays monolithically integrated on silicon," Opt. Express 22, A1768-A1775 (2014), Optical Society of America.

* cited by examiner

LIGHT EMITTING DIODES (LEDS) WITH STACKED MULTI-COLOR PIXELS FOR DISPLAYS

CROSS-REFERENCE TO RELATED APPLICATIONS

This application claims the priority of U.S. Provisional Application No. 62/337,900, entitled "3 Color stacked RGB pixel using Fin and Nanowire LEDs for smart displays" filed on May 18, 2016; U.S. Provisional Application No. 62/337,899, entitled "Method of Forming GaN MQW FIN Structures for LED Displays" filed on May 18, 2016; and U.S. Provisional Application No. 62/337,902, entitled "Vertically stacked RGB LED pixel for smart display" filed on May 18, 2016. In addition, this application is concurrently filed with and cross-references to United States Patent Application titled "LEDs WITH THREE COLOR RGB PIXELS FOR DISPLAYS" U.S. Pat. No. 15/599,458 which claims the priority of U.S. Provisional Application No. 62/337,901, entitled "Three-Color RGB pixel using m-plane nanowire LEDs for smart displays" filed on May 18, 2016; U.S. Provisional Application No. 62/337,899, entitled "Method of Forming GaN MQW FIN Structures for LED Displays" filed on May 18, 2016; and U.S. Provisional Application No. 62/355,895, entitled "3 Color RGB pixel using fin LEDs for smart displays" filed on May 18, 2016; and further filed with and cross-references to United States Patent Application titled "LIGHT EMITTING DIODES (LEDs) WITH INTEGRATED CMOS CIRCUITS" U.S. Pat. No. 15/599,438 which claims the priority of U.S. Provisional Application No. 62/337,904, entitled "Integration of semiconductor LED with Si integrated circuits and TFTs" filed on May 18, 2016 and United States Patent Application titled "INTEGRATED SMART DISPLAY SYSTEM WITH MULTI-COLOR LIGHT EMITTING DIODES (LEDs)" U.S. Pat. No. 15/599,465 which claims the priority of U.S. Provisional Application No. 62/337,898, entitled "Smart display system and method of forming there of" filed on May 18, 2016. All disclosures are incorporated herewith by reference in their entireties for all purposes.

BACKGROUND

Light emitting diodes (LEDs) are widely used for various color display technologies, including televisions, smart phones and computer monitors. For portable applications, there is a need or demand for low cost, low power, high brightness and high resolution display pixel technology. Such requirement is particularly apparent for portable and small form factor displays, such as smart phones and head mount display devices which are used in virtual reality (VR) and augmented reality (AR) applications.

To form color displays, 3 primary colors are needed. The three primary colors are red, green and blue. However, conventional color displays using red, green and blue LEDs are complex, leading to high manufacturing cost. For example, conventional color displays employ different materials or components for different color LEDs, including color phosphors, color filters and down convertors. Furthermore, the complexity of conventional color displays is not conducive to high resolution, particular with small form factor displays.

The present disclosure is directed to cost effective and high resolution color LED displays.

SUMMARY

A device is disclosed. In one embodiment, the device includes a substrate having a device well and a color stacked light emitting diode (LED) pixel disposed on the substrate. The color stacked LED pixel includes an LED pixel structure body, a base LED disposed on at least a portion of the LED pixel structure body, an intermediate LED disposed on the base LED and a top LED disposed on the intermediate LED.

In another embodiment, a method of forming a device is presented. The method includes providing a substrate having a device well and forming a color stacked light emitting diode (LED) pixel disposed on the substrate. The color stacked LED pixel includes an LED pixel structure body, a base LED disposed on at least a portion of the LED pixel structure body, an intermediate LED disposed on the base LED and a top LED disposed on the intermediate LED.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. More particularly, embodiments relate to semiconductor devices having light emitting diodes (LEDs) with three-color pixels. In one embodiment, the three-color LEDs are disposed on the same substrate or wafer. The LEDs may be used in high brightness and high resolution color displays, including wearable devices and head mount display devices, such as those employed in virtual reality (VR) or augmented reality (AR) applications. The LEDs may also be used in other applications.

Figure 1A:
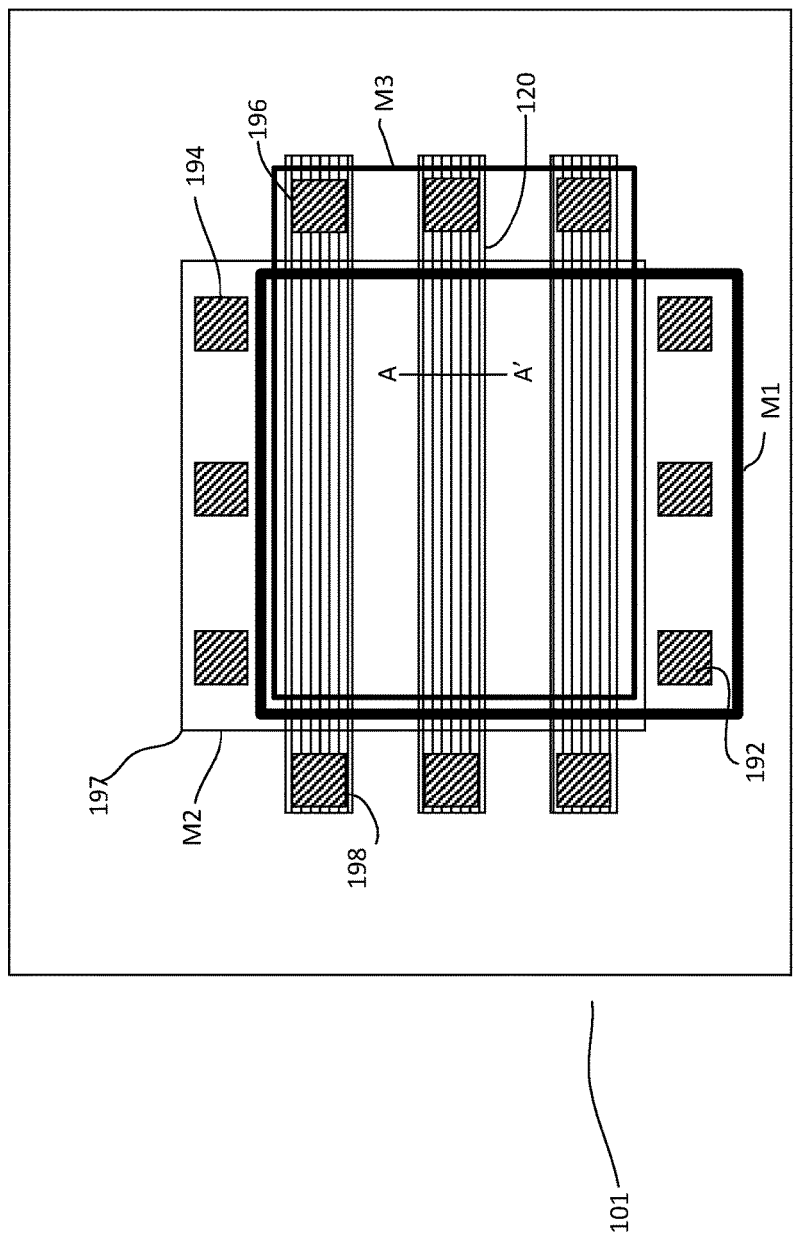
FIGS. 1a-b show top and cross-sectional views of an embodiment of a device.
Figure 1B:
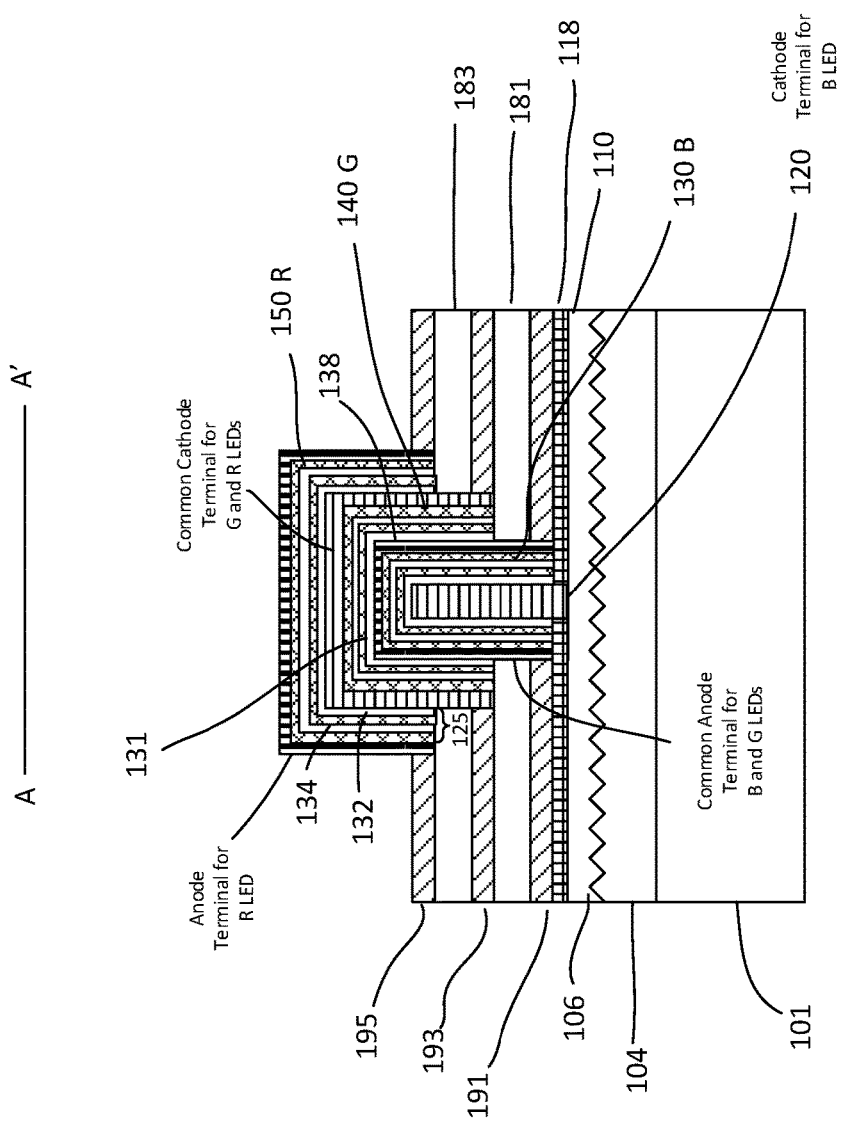

FIGS. 1a-b show top and cross-section views of an embodiment of a device 100. The cross-sectional view is along A-A' of the top view. Referring to FIGS. 1a-b, the device includes a substrate 101. The substrate may be a bulk semiconductor substrate, such as a silicon (Si) substrate. In other embodiments, the substrate may be a silicon carbide (SiC), silicon on insulator (SOI) substrate, or a sapphire substrate.

In the case of a silicon substrate, it may be a (111) oriented substrate. A Si(111) oriented substrate has a top or surface plane with a (111) crystal orientation. In alternative embodiments, the silicon substrate may be a (100) oriented substrate. A Si(100) oriented substrate has a top or surface plane with a (100) crystal orientation. In the case of a (100) substrate, it is processed to form V-grooves 106 on the surface to expose the (111) crystal orientation. In other words, the Si(100) substrate is processed to transform it to be a Si(111) substrate.

In one embodiment, the substrate includes a doped device well 104. The doped well, for example, extends from the surface of the substrate to a depth of about 0.5 um. Other depths may also be useful. The doped device well may be heavily doped with first polarity type dopants. In one embodiment, the doped device well is a heavily doped n-type (n$^+$) device well. The doped device well may serve as a common cathode terminal for the LEDs. Alternatively, the doped well may be a p$^+$ doped well. The dopant concentration of the heavily doped device well may be about $10^{20}$ atoms/cm$^3$. Other dopant concentrations for the heavily doped device well may also be useful. The dopant concentration may depend on, for example, the technology node.

A base layer 110 may be disposed on the substrate surface. The base layer may be a composite base layer having multiple layers. In one embodiment, the base layer includes a first base or nucleation layer and a second base or buffer layer. The nucleation layer is disposed on the substrate and the buffer layer is disposed on the nucleation layer. The nucleation layer facilitates in forming the buffer layer on the substrate. In one embodiment, the nucleation layer facilitates growing a buffer layer with a wurtzite crystal structure.

The nucleation layer may be an aluminum nitride (AlN) layer and the buffer layer may be a gallium nitride (GaN) layer. Other types of nucleation layers which facilitate growing a buffer layer with a wurtzite crystal structure may also be useful. Other types of nucleation layers may also be used. The thickness of the nucleation layer may be about 50-200 nm while the buffer layer may be about 0.5-2 um. Other thicknesses for the nucleation and buffer layers may also be useful. In the case of grooves on the top surface of the substrate, the base layer may be planarized to form a planar surface. This results in the second base layer having a planar top surface. Alternatively, the second base layer is planarized to form a planar top surface.

The substrate, as shown, includes a pixel region contains a multi-color LED pixel. In one embodiment, the multi-color pixel is a three-color LED pixel. The three colors of the LED pixel are red (R), green (G) and blue (B). For example, the pixel is a RGB pixel. In one embodiment, the LED pixel includes a stacked fin-type multi-color LED. A stacked fin LED includes a fin body 120. The fin body serves as a base of the stacked LED. The fin body is an elongated member disposed along a first direction of the substrate or semiconductor wafer 101. The first direction, for example, may be referred to as a row direction. For example, a fin body is disposed along the row direction. In the case of (100) silicon substrate with grooves, the fin body is disposed in the direction of the V-grooves. For example, the V-grooves 106 and the fin body are disposed along the row direction.

A fin body is a gallium nitride (GaN) fin body. In one embodiment, the fin body is an epitaxial GaN fin body. In one embodiment, a fin body is a first polarity type doped GaN fin body. For example, in the case where the device well is n-doped, the fin body is a n-doped GaN (n-GaN) fin body. The fin body may be medium doped fin body. The dopant concentration of the fin body may be about 1e$^{18}$ atoms/cm$^3$. Other dopant concentrations for the fin body may also be useful. Doping the fin body may be achieved by in-situ doping during epitaxial growth or by ion implantation after formation.

In one embodiment, the buffer layer facilitates forming the fin bodies by epitaxy. A dielectric mask layer 118 is disposed on the substrate over the base layer to facilitate selective epitaxial growth (SEG) of the fin bodies on the substrate. For example, the mask layer includes an opening to expose the base layer for SEG of the fin body. In one embodiment, the dielectric mask layer is a SiN layer. Other types of dielectric mask layers may also be useful.

The fin body, in one embodiment, includes a B LED 130, a G LED 140 and a R LED 150 which are configured one above another in a stack. The fin body with the LEDs forms an LED unit. The LED unit may correspond to an LED row unit of an LED pixel. In one embodiment, an LED pixel may include a plurality of LED row units in the row direction which are interconnected in a second or column direction. As shown, the pixel includes 3 rows or LED row units. Providing other number of LED units may also be useful. The number of LED units may depend on, for example, the desired pixel intensity and/or the desired pixel resolution. For example, more LED units may be provided to achieve higher pixel intensity.

The B LED, G LED and R LED of an LED unit are stacked in sequence. For example, the B LED is the bottom or base LED, the G LED is the intermediate LED and the R LED is the top LED of the stack. In one embodiment, the stacked LED unit is an overlapping stacked LED unit with overlapping LEDs. An overlapping LED is an LED which is disposed above and contacts a portion of an LED below. In one embodiment, the overlapping stacked LED includes a base LED overlapped by an intermediate LED and a top LED overlaps the intermediate LED. For example, the base LED is disposed on the fin body, the intermediate LED is disposed on the base LED and the top LED is disposed on the intermediate LED. A fin body height, width and length dimension to accommodate the base LED. In one embodiment, the fin body has a height of about 2 um, a width of about 200 nm and a length of about 1 um. Other dimensions for the fin body may also be useful.

An LED includes a multiple quantum well (MQW) 125 disposed on an LED base layer 131. The base layer may be a GaN base layer. The base layer, in one embodiment, is a p-GaN base layer. The thickness of the base layer may be about 200 nm. In the base of the base LED, the base layer may be the fin body. As for the MQW, it includes y quantum wells (QWs), where y is ≥2. The MQW may include about 2-6 QWs. In one embodiment, a MQW includes two QWs. Other number of QWs may also be useful. The number of QWs may depend on, for example, the desirable optical efficiency. A quantum well includes a well layer 132 sandwiched by barrier layers 134. The barrier layer may be served by a barrier layer from a previous or subsequent QW or by an LED base layer 131.

In one embodiment, the well layer of a QW includes an indium gallium nitride (InGaN) layer and a barrier layer includes a GaN layer. The layers of the MQW may be formed by SEG. The GaN barrier layer may be an undoped layer or a layer doped with first or second polarity type dopants. Other barrier layers, for example, metallic layers with wurtzite crystal structure, may also be useful. The thickness of the well layer may be about 3 nm while the thickness of the barrier layer is about 12 nm. Other thicknesses may also be useful. For example, in the case where the barrier layer is served by the body or top LED layer, the thickness of the barrier layer may be thicker. Other configurations of the well and barrier layers may also be useful.

In one embodiment, the B or base LED is disposed on the fin body. The fin body, in one embodiment, is a n-GaN fin body and serves as a cathode terminal of the B LED. A B MQW is disposed on the fin body. The B MQW includes a first B well layer disposed on the fin body, a first B barrier layer on the first B well layer, a second B well layer on the first B barrier layer and a second B barrier layer on the second B well layer. The barrier layers are GaN layers while the well layers are InGaN layers.

A top LED layer 138 is disposed on the B MQW. An electron blocking layer (not shown) is disposed between the top LED layer and B MQW. For example, a top B LED layer is disposed on the electron blocking layer (EBL) which is on the B MQW. The EBL may be an undoped layer. The EBL, for example, may be an undoped GaN or AlGaN layer. Other types of EBLs may also be useful. The top LED layer, in one embodiment, is a second polarity doped GaN top LED layer. For example, in the case of a n-GaN fin, the top LED layer is a p-GaN layer. The dopant concentration of the top LED p-GaN layer may be about $\geq 10^{19}$ atoms/cm$^3$. Other dopant concentrations for the top LED layer may also be useful. The top LED layer may be epitaxially grown. Doping the top LED layer may be achieved by in-situ doping during epitaxial growth or by ion implantation after formation. In one embodiment, the fin body serves as a cathode terminal of the B LED and the top B LED layer serves as an anode terminal.

A first metal layer 191 is disposed on the dielectric mask layer 118. The first metal layer, for example, represents M1 of the device. The first metal layer may be an Al or W layer. Other types of conductive materials, such copper or copper alloy, may also be used as the metal layer. The thickness of the metal layer may be about 0.25 um. Other thicknesses may also be useful. The metal layer, as shown, is coupled to the top LED layer of the B LED. For example, the metal layer is coupled to the anode terminal of the B LED. Also, the metal layer is coupled to the anode terminal of the intermediate LED. This is because the top B LED layer also serves as the anode terminal for the intermediate LED.

A first interlevel dielectric layer 181 is disposed over the first metal layer. The first interlevel dielectric layer may be a silicon oxide layer. Other types of interlevel dielectric layers may also be useful. The thickness of the interlevel dielectric layer may be about 0.5 um. Other thicknesses for the interlevel dielectric layer may also be useful. The first metal layer and the first interlevel dielectric layer cover a lower portion of the B LED, leaving an upper portion of the B LED exposed.

In one embodiment, the G or intermediate LED is disposed on the exposed portion of the top B LED layer. The intermediate and base LEDs share a common anode terminal. A G MQW is disposed on the exposed portion of the top B LED layer. In one embodiment, an EBL (not shown) is disposed between the G MQW and p-GaN layers. The p-GaN layer serves as the common B and G anode terminal. A first G barrier layer (GaN) is disposed on the EBL, a first G well layer (InGaN) is disposed on the first G barrier layer, a second G barrier layer (GaN) is disposed on the first G well layer and a second G well layer (InGaN) is disposed on the second G well layer. A G base layer (n-GaN) is disposed on the second G well layer. The G base layer serves as a cathode terminal of the G LED.

A second metal layer 193 is disposed on the first interlevel dielectric layer 181. The second metal layer, for example, represents M2 of the device. The second metal layer may be a transparent conductive oxide (TCO) layer. The TCO layer may be an indium tin oxide (ITO) layer. Other types of transparent conductive oxides may also be useful. The thickness of the second metal layer may be about 0.25 um. Other thicknesses may also be useful. The second metal layer, as shown, is coupled to the G base layer (n-GaN). For example, the second metal layer is coupled to the cathode terminals of the intermediate or G LED and top or R LED.

A second interlevel dielectric layer 183 is disposed over the second metal layer. The second interlevel dielectric layer may be a silicon oxide layer. Other types of interlevel dielectric layers may also be useful. The thickness of the interlevel dielectric layer may be about 0.5 um. Other thicknesses for the interlevel dielectric layer may also be useful. The second metal layer and the second interlevel dielectric layer cover a lower portion of the G LED, leaving an upper portion of the G LED exposed.

The G base layer, in one embodiment, also serves as the base for the top or R LED. For example, the G base layer serves as a common cathode terminal for both the G and R LEDs. In one embodiment, a R MQW is disposed on the exposed portion of the G base layer. The R MQW includes two QWs. For example, a first R well layer (InGaN) is disposed on the G base layer, a first R barrier layer (GaN) is disposed on the first R well layer, a second R well layer (InGaN) is disposed on the first R barrier layer and a second R barrier layer (GaN) is disposed on the second R well layer.

A top LED layer is disposed on the R MQW. For example, a top R LED layer is disposed on the R MQW. The top LED layer, in one embodiment, is a second polarity doped GaN top LED layer. For example, the top LED layer is a p-doped GaN layer. In one embodiment, the top R LED layer serves as an anode terminal and the G base layer serves as the cathode terminal of the R LED.

A third metal layer 195 is disposed on the second interlevel dielectric layer 183. The third metal layer, for example, represents M3 of the device. The third metal layer may be a TCO layer, such as ITO. Other types of transparent conductive oxides may also be useful. The thickness of the third metal layer may be about 0.25 um. Other thicknesses may also be useful. The third metal layer, as shown, is coupled to the top LED layer. For example, the third metal layer is coupled to the anode terminal of the top R LED. Standard BEOL processes, for example, passivation, are followed to complete the LED chip routing to achieve the desired functionality.

To summarize, the LEDs of the LED unit each includes an anode terminal and a cathode terminal. The different terminals of the LEDs are coupled to different metal levels or to GND through the doped well 104. Table 1 shows the interconnections of the terminals of the different LEDs of the LED unit:

TABLE 1

| | Terminals | |
|---|---|---|
| LEDs | Anode | Cathode |
| Red | M3 | M2 |
| Green | M1 | M2 |
| Blue | M1 | Well (GND) |

A metal layer includes a contact region 197 to accommodate contacts. For example, M1 includes a M1 contact region for accommodating M1 contacts 192, M2 includes a M2 contact region for accommodating M2 contacts 194 and M3 includes a M3 contact region for accommodating M3 contacts 196. In addition, the doped well 104 may include a well contact region for accommodating well contacts 198. The well contacts serve to couple the base or fin bodies of the LED units.

The contact regions of the different levels, including the well level, extend from different sides of the pixel to provide access without shorting the contacts of different levels with other levels. The contacts may be Al or W contacts. Other types of conductive materials, such as copper or copper alloy, may also be useful. As shown, the contacts are via contacts. In some embodiment, the contacts of a metal level may be configured as a bar contact. The contacts may serve as LED mirrors. The contacts may be coupled to contact pads to provide external access to the LED pixels disposed on a metal or pad level above a top dielectric layer (not shown). Other configurations of contact pads may also be useful.

As discussed, the pixel includes stacked R, G and B LEDs. The different color LEDs have different bandgaps. In one embodiment, the different bandgaps for different color LEDs are achieved by varying the percentage (atomic percentage) of indium (In) in the well layers of the MQW. In one embodiment, the percentage of In of the InGaN layer of the well layers of the MQW is varied to achieve different bandgaps for different color LEDs. For example, x defines the percentage of In in the $In_xGa_{1-x}N$ well layer. In one embodiment, the percentage of In for the $In_xGa_{1-x}N$ layer in the MQW may be as follows:

Blue: x=15-20%;

Green: x=25-30%; and

Red: x=35-40%.

Other percentages of In may be useful, as long as the different bandgaps have sufficient separation.

The base for the different color LEDs may be configured to have different widths. The different widths facilitate having different percentages of In in the well layers of the MQW. The well layers with higher In percentage is facilitated with a narrower base or body. In one embodiment, the width of the base for the R LED is less than about 100 nm, the width of the base for the G LED may be about 200 nm while the width of the base of the B LED is greater than about 300 nm. In other embodiments, the width of the base for the R LED is about 25-125 nm, the width of the base for the G LED is about 150-250 nm while the width of the base of the B LED is greater than about 300-400 nm. Other widths for different bases may also be useful. In the case where different color LEDs, such as G and R LEDs, share a common base, a narrow width of the two different color LEDs may be used to facilitate a higher In percentage.

Although the device is shown with one pixel, it is understood that the device may include a plurality of pixels interconnected in the row and column directions to form a matrix of pixels of an LED display. The number of pixels depends on the form factor of the display.

Figure 2A:
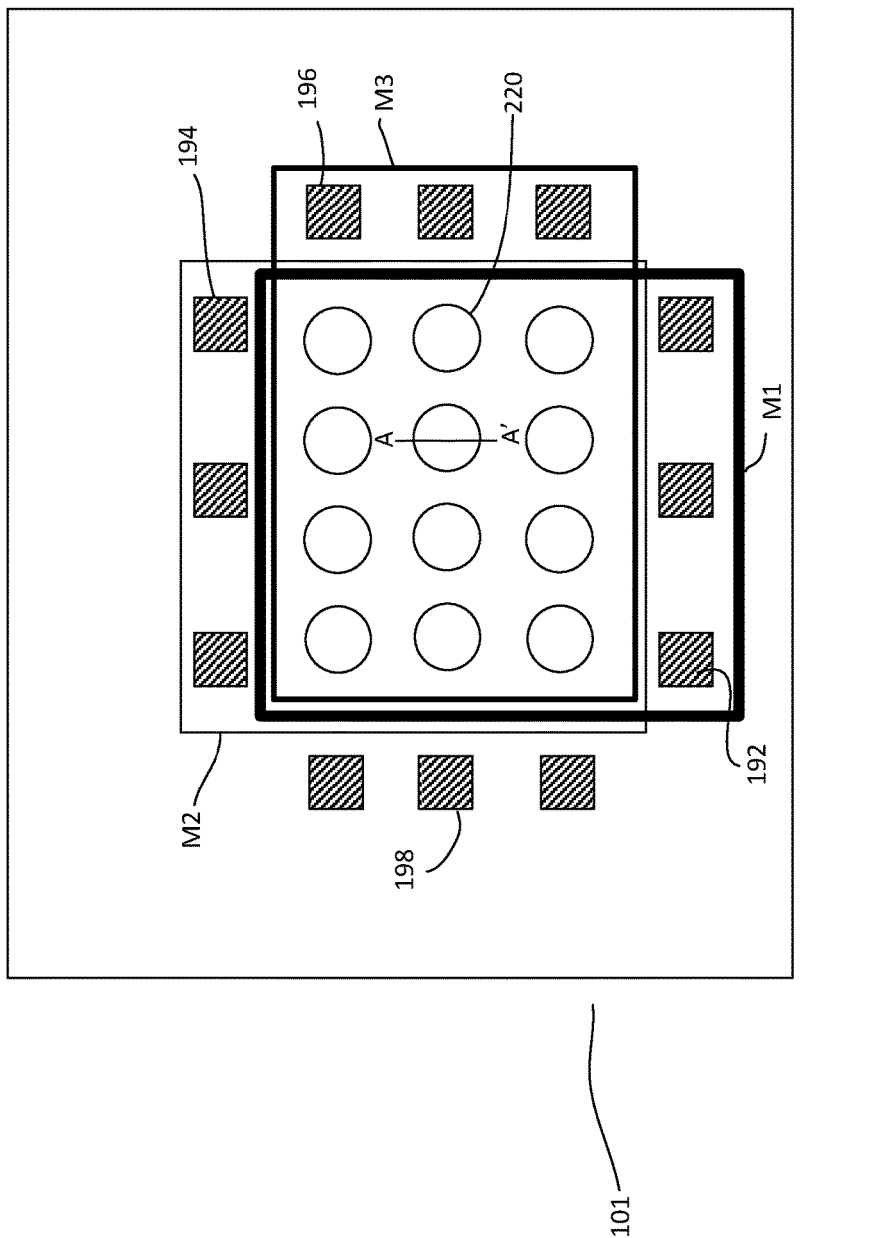
FIGS. 2a-b show top and cross-sectional views of another embodiment of a device.
Figure 2B:
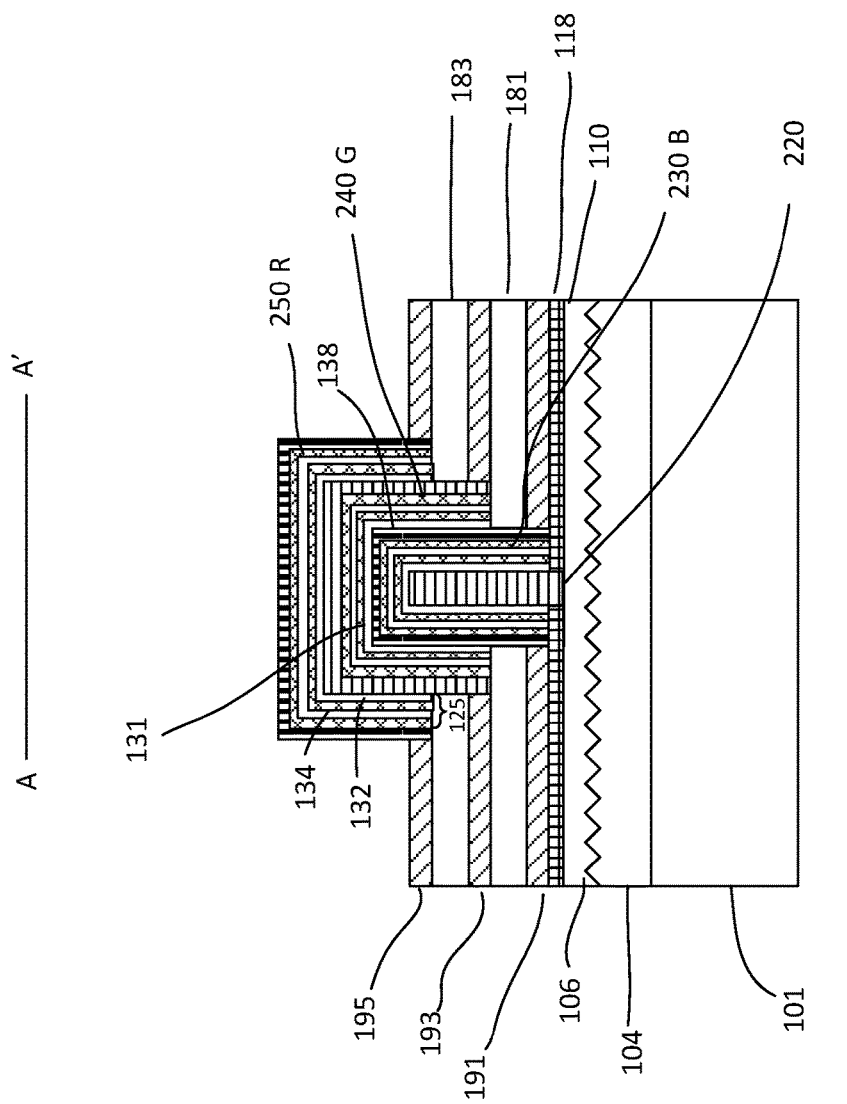

FIGS. 2a-b show top and cross-section views of another embodiment of a device 200. The cross-sectional view is along A-A' of the top view. The device is similar to the device of FIGS. 1a-b. Common elements may not be described or described in detail. Referring to FIGS. 2a-b, the device includes a substrate 101. The substrate may be a bulk semiconductor substrate, such as a silicon (Si) substrate. Other types of substrates, such as a SiC, silicon on insulator (SOI) substrate, or a sapphire substrate, may also be used.

In the case of a silicon substrate, it may be a (111) oriented substrate. In alternative embodiments, the silicon substrate may be a (100) oriented substrate. A Si(100) oriented substrate may be processed to form V-grooves 106 on the surface to expose the (111) crystal orientation.

In one embodiment, the substrate includes a doped device well 104. The doped device well may be heavily doped with first polarity type dopants. In one embodiment, the doped device well is a heavily doped n-type ($n^+$) device well. A base layer 110 may be disposed on the substrate surface. The base layer may be a composite base layer having multiple layers. In one embodiment, the base layer includes a first base or nucleation layer and a second base or buffer layer. The nucleation layer is disposed on the substrate and the buffer layer is disposed on the nucleation layer. The nucleation layer may be an aluminum nitride (AlN) layer and the buffer layer may be a gallium nitride (GaN) layer.

The substrate, as shown, includes a pixel region containing a multi-color LED pixel, such as a RGB LED pixel. In one embodiment, the LED pixel includes a stacked nanowire multi-color LED. The stacked nanowire LED is similar to the stacked fin LED except that the LED body is a nanowire body 220 instead of a fin body. The nanowire body serves as a base of the stacked LED. The nanowire body may be an elongated member having a circular cross-sectional shape disposed on the substrate. Providing other cross-sectional shaped nanowire bodies may also be useful. The nanowire body extends from the substrate in a direction perpendicular to its surface. The nanowire body may have a height sufficient to accommodate the base LED. In one embodiment, the nanowire body has a height of about 1 um and a diameter of about 200 nm. Other nanowire body dimensions may also be useful. In one embodiment, sides of the nanowire body extend from the substrate surface are along a m-plane while the top of the body is along a c-plane.

A nanowire body may be a gallium nitride (GaN) nanowire body. In one embodiment, the body is an epitaxial GaN nanowire body. In one embodiment, a nanowire body is a first polarity type doped GaN body. For example, the body is a n-doped GaN (n-GaN) nanowire body. Doping the nanowire body may be achieved by in-situ doping during epitaxial growth or by ion implantation after formation.

In one embodiment, the buffer layer facilitates forming the nanowire body by epitaxy. The buffer layer reduces defects and provides a low defective templet for the growth of nanowire body. A dielectric mask layer 118 is disposed on the substrate over the base layer to facilitate selective epitaxial growth (SEG) of the nanowire bodies on the substrate. For example, the mask layer includes an opening to expose the base layer for SEG of the nanowire body. In one embodiment, the dielectric mask layer is a SiN layer. Other types of dielectric mask layers may also be useful.

The nanowire body, in one embodiment, includes a B LED 230, a G LED 240 and a R LED 250 which are configured one above another in a stack. The nanowire body with the LEDs forms an LED unit. In one embodiment, the pixel includes a plurality of LED units arranged in a matrix. For example, the LED units may be arranged in m rows and n columns of LED units. As shown, the pixel includes a 3×4 matrix of LED units (3 rows and 4 columns). Providing other number of rows and columns for the matrix, including 1, may also be useful. For example, the pixel may include 1 LED unit. The number of LED units may depend on, for example, the desired pixel intensity and/or the desired pixel resolution. For example, more LED units may be provided to achieve higher pixel intensity.

The B LED, G LED and R LED of an LED unit are stacked in sequence. For example, the B LED is the bottom or base LED, the G LED is the intermediate LED and the R LED is the top LED of the stack. In one embodiment, the stacked LED unit is an overlapping stacked LED unit with overlapping LEDs. In one embodiment, the base LED is disposed on the body, the intermediate LED is disposed on base LED and the top LED is disposed on the intermediate LED.

An LED includes a multiple quantum well (MQW) 125 disposed on an LED base layer 131. The base layer may be a GaN base layer. The base layer, in one embodiment, is a p-GaN base layer. The thickness of the base layer may be about 200 nm. In the base of the base LED, the base layer may be the nanowire body. As for the MQW, it includes y quantum wells (QWs), where y is ≥2. The MQW may include about 2-6 QWs. In one embodiment, a MQW includes two QWs. Other number of QWs may also be useful. The number of QWs may depend on, for example, the desirable optical efficiency. A QW includes a well layer 132 sandwiched by barrier layers 134. The barrier layer may be served by a barrier layer from a previous or subsequent QW or by an LED base layer 131. In one embodiment, the well layer of a QW includes an InGaN layer and the barrier layer includes a GaN layer.

In one embodiment, the B or base LED is disposed on the nanowire body. The body serves as the base layer of the LED. A B MQW is disposed on the nanowire body. The B MQW includes a first B well layer disposed on the nanowire body, a first B barrier layer on the first B well layer, a second B well layer on the first B barrier layer and a second B barrier layer on the second B well layer. A top LED layer 138 is disposed on the B MQW. In one embodiment, an EBL (not shown), such as an undoped GaN or AlGaN layer, is disposed between the top LED layer and B MQW. For example, a top B LED layer is disposed on the EBL which is disposed on the B MQW. The top LED layer, in one embodiment, is a second polarity doped GaN top LED layer, such as a p-GaN layer.

A first metal layer 191 is disposed on the dielectric mask layer 118. The first metal layer, for example, represents M1 of the device. The metal layer, as shown, is coupled to the top LED layer of the B LED. For example, the metal layer is coupled to the anode terminal of the B LED. Also, the metal layer is coupled to the anode terminal of the intermediate LED. A first interlevel dielectric layer 181 is disposed over the first metal layer. The first interlevel dielectric layer may be a silicon oxide layer. The first metal layer and the first interlevel dielectric layer cover a lower portion of the B LED, leaving an upper portion of the B LED exposed.

In one embodiment, the intermediate or G LED is disposed on the exposed portion of the top B LED layer. The intermediate and base LEDs share a common anode terminal. A G MQW is disposed on the exposed portion of the top B LED layer. In one embodiment, an EBL (not shown) is disposed between the G MQW and p-GaN layer which serves as the common B and G anode terminal. A first G barrier layer (GaN) is disposed on the EBL, a first G well layer (InGaN) is disposed on the first G barrier layer, a second G barrier layer (GaN) is disposed on the first G well layer and a second G well layer (InGaN) is disposed on the second G well layer. A G base layer (n-GaN) is disposed on the second G well layer. The G base layer serves as a cathode terminal of the G LED.

A second metal layer 193 is disposed on the first interlevel dielectric layer 181. The second metal layer, for example, represents M2 of the device. The second metal layer may be a transparent conductive oxide (TCO) layer. Other types of conductive oxides or transparent conductive layers, such as graphene, may also be useful. The second metal layer, as shown, is coupled to the G base layer (n-GaN). For example, the second metal layer is coupled to the cathode terminal of the intermediate or G LED. A second interlevel dielectric layer 183 is disposed over the second metal layer. The second interlevel dielectric layer may be a silicon oxide layer. The second metal layer and the second interlevel dielectric layer cover a lower portion of the G LED, leaving an upper portion of the G LED exposed.

The G base layer, in one embodiment, also serves as the base for the top or R LED. For example, the G base layer serves as a common cathode terminal for both the G and R LEDs. In one embodiment, a R MQW is disposed on the exposed portion of the G base layer. The R MQW includes two QWs. For example, a first R well layer (InGaN) is disposed on the G base layer, a first R barrier layer (GaN) is disposed on the first R well layer, a second R well layer (InGaN) on the first R barrier layer and a second R barrier layer (GaN) is disposed on the second R well layer.

A top LED layer is disposed on the R MQW. For example, a top R LED layer is disposed on the R MQW. The top LED layer, in one embodiment, is a second polarity doped GaN top LED layer. For example, the top LED layer is a p-doped GaN layer. In one embodiment, the top R LED layer serves as an anode terminal and the G base layer serves as the cathode terminal of the R LED.

A third metal layer 195 is disposed on the second interlevel dielectric layer 183. The third metal layer, for example, represents M3 of the device. The third metal layer may be a TCO layer, such as ITO. Other types of conductive oxides may also be useful. The third metal layer, as shown, is coupled to the top LED layer. For example, the third metal layer is coupled to the anode terminal of the top R LED. Standard BEOL processes, for example, passivation, are followed to complete the LED chip routing to achieve the desired functionality.

The LEDs of the LED unit each include an anode and cathode terminals. The different terminals of the LEDs are coupled to different metal level or to GND through the doped well 104. Table 1, as already provided, shows the interconnections of the terminals of the different LEDs of the LED unit A metal layer includes a contact region 197 to accommodate contacts. For example, M1 includes a M1 contact region for accommodating M1 contacts 192, M2 includes a M2 contact region for accommodating M2 contacts 194 and M3 includes a M3 contact region for accommodating M3 contacts 196. In addition, the doped well 104 may include a well contact region for accommodating well contacts 198. The well contacts serve to couple the base or nanowire bodies of the LED units.

The contact regions of the different levels, including the well level, extend from different sides of the pixel to provide access without shorting the contacts of different levels with other levels. The contacts may be Al or W contacts. Other types of conductive materials, such as copper or copper alloy may also be useful. As shown, the contacts are via contacts. In some embodiment, the contacts of a metal level may be configured as a bar contact. The contacts may serve as LED mirrors. The contacts may be coupled to contact pads to provide external access to the LED pixels disposed on a metal or pad level above a top dielectric layer (not shown). Other configurations of contact pads may also be useful.

As discussed, the pixel includes stacked R, G and B LEDs. The different color LEDs have different bandgaps. In one embodiment, the different bandgaps for different color LEDs are achieved by varying the percentage (atomic percentage) of In in the well layers of the MQW. In one embodiment, the percentage of In of the InGaN layer of the well layers of the MQW is varied to achieve different bandgaps for different color LEDs. For example, x defines the percentage of In in the $In_xGa_{1-x}N$ well layer. In one embodiment, the percentage of In for the $In_xGa_{1-x}N$ layer in the MQW may be as follows:

Blue: x=15-20%;

Green: x=25-30%; and

Red: x=35-40%.

Other percentages of In may be useful, as long as the different bandgaps have sufficient separation.

The width of the LEDs may depend on the In percentage in the $In_xGa_{1-x}N$ well layer. Epi loading effects cause In atoms diffuse from the nanowire body into the growing crystal. In one embodiment, the width of a B LED is greater than about 300 nm, the width of a G LED is about 200 nm, and the width of a R LED is less than about 100 nm. For example, a R LED has a higher In percentage in the $In_xGa_{1-x}N$ well layer and therefore it has a shorter LED width. Other widths for the different LEDs may also be useful. For example, in the case the LEDs share a common body, the narrower width may be used to facilitate a higher In percentage.

Although the device is shown with one pixel, it is understood that the device may include a plurality of pixels interconnected in the row and column directions to form a matrix of pixels of an LED display. The number of pixels depends on the form factor of the display.

Figure 3A:
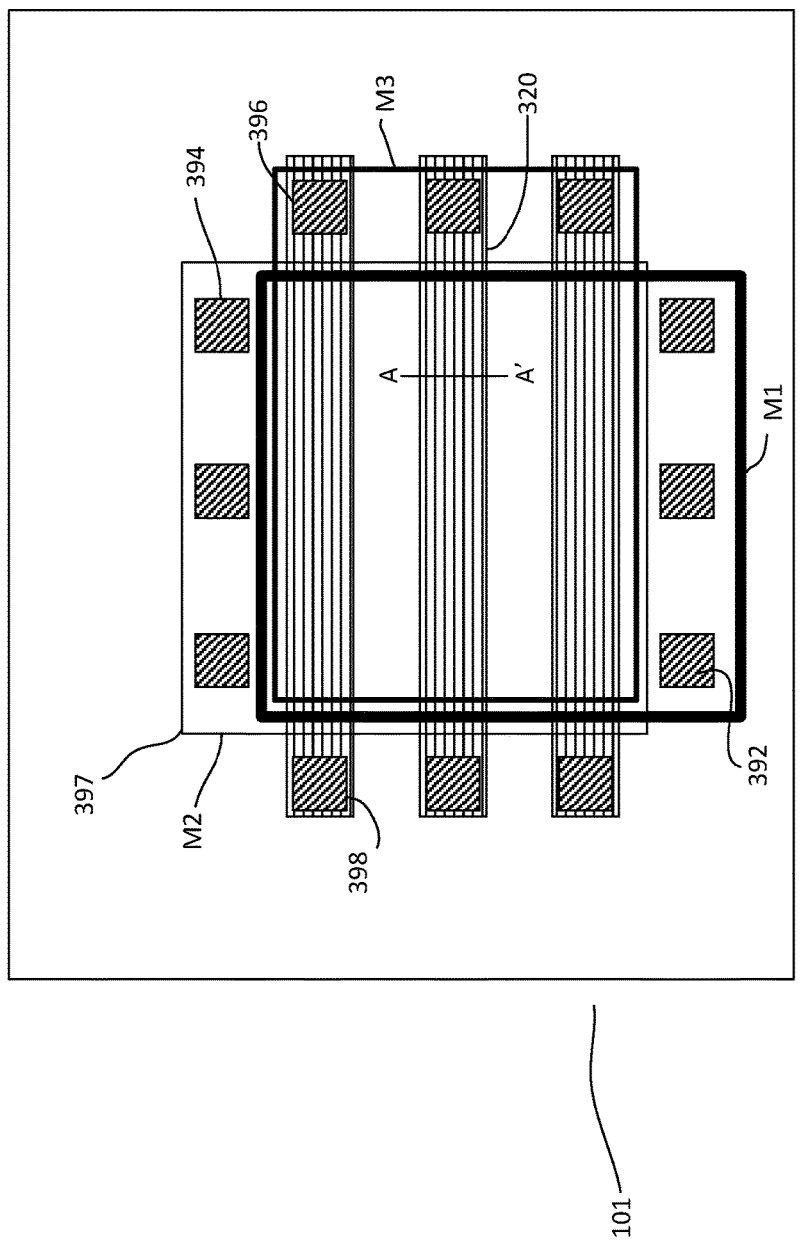
FIGS. 3a-b show top and cross-sectional views of another embodiment of a device.
Figure 3B:
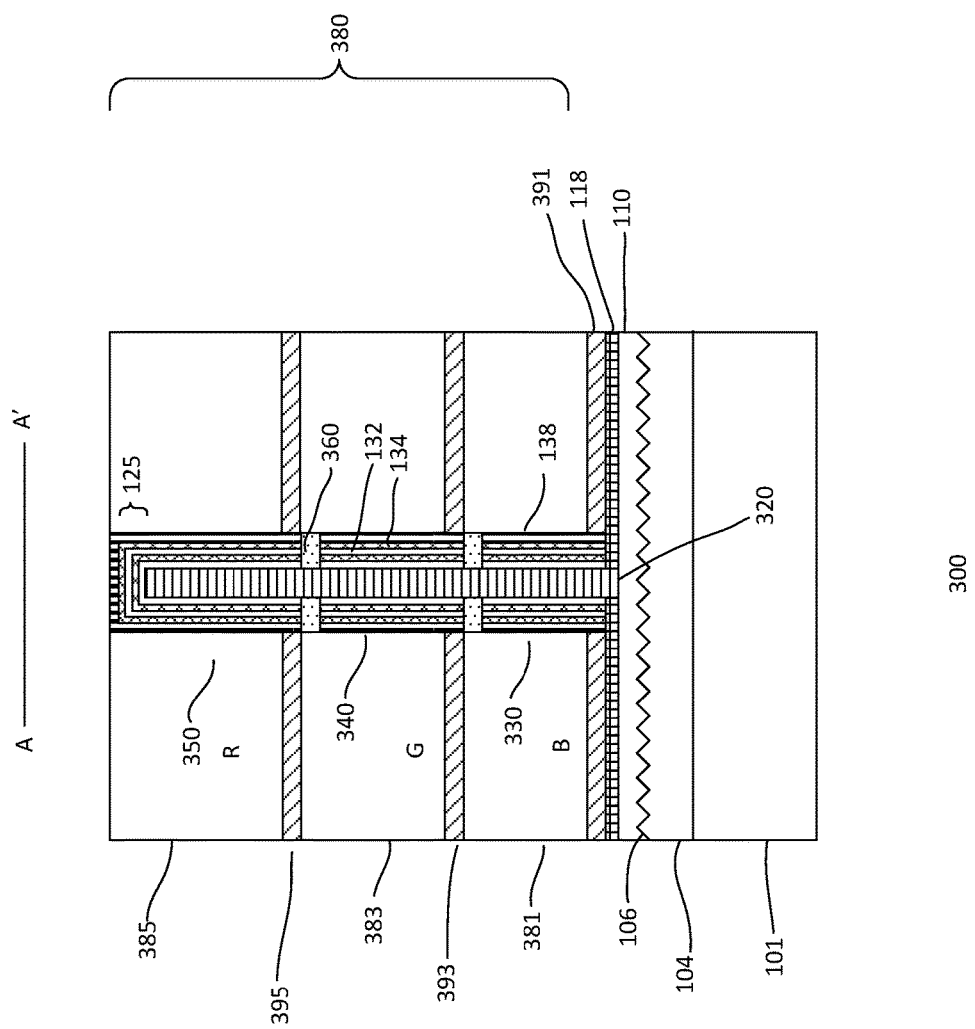

FIGS. 3a-b show top and cross-section views of an embodiment of a device 300. The cross-sectional view is along A-A' of the top view. The device is similar to that described in FIGS. 1a-b and 2a-b. Common elements may not be described or described in detail. Referring to FIGS. 3a-b, the device includes a substrate 101. The substrate may be a bulk semiconductor substrate, such as a silicon (Si) substrate. In other embodiments, the substrate may be a silicon carbide (SiC), silicon on insulator (SOI) substrate, or a sapphire substrate.

In the case of a silicon substrate, it may be a (111) oriented substrate. A Si(111) oriented substrate has a top or surface plane with a (111) crystal orientation. In alternative embodiments, the silicon substrate may be a (100) oriented substrate. A Si(100) oriented substrate has a top or surface plane with a (100) crystal orientation. In the case of a (100) substrate, it is processed to form V-grooves 106 on the surface to expose the (111) crystal orientation.

In one embodiment, the substrate includes a doped device well 104. The doped well, for example, extends from the surface of the substrate to a depth of about 0.5 um. Other depths may also be useful. The doped device well may be heavily doped with first polarity type dopants. In one embodiment, the doped device well is a heavily doped n-type ($n^+$) device well.

A base layer 110 may be disposed on the substrate surface. The base layer may be a composite base layer having multiple layers. In one embodiment, the base layer includes a first base or nucleation layer, such as an AlN layer, and a second base or buffer layer, such as a GaN layer. The nucleation layer is disposed on the substrate and the buffer layer is disposed on the nucleation layer. The base layer includes a planar top surface. The planar top surface may result from processing the base layer.

The substrate, as shown, includes a pixel region containing a multi-color LED pixel. The multi-color LED pixel includes R, G and B LEDs. In one embodiment, the LED pixel includes a stacked fin-type multi-colored LED. A stacked fin LED includes a fin body 320. The fin body serves as a base of the stacked fin LED. The fin body is an elongated member disposed along a first direction of the substrate or semiconductor wafer 101. The first direction, for example, may be referred to as a row direction. For example, a fin body is disposed along the row direction. In the case of (100) silicon substrate with grooves, the fin body is disposed in the direction of the V-grooves. For example, the V-grooves 106 and fin body 320 are disposed along the row direction. A fin body is a gallium nitride (GaN) fin body. In one embodiment, the fin body is an epitaxial GaN fin body. In one embodiment, a fin body is a first polarity type doped GaN fin body, such as n-GaN fin body.

In one embodiment, the buffer layer facilitates forming the fin bodies by epitaxy. A dielectric mask layer 118 is disposed on the substrate over the base layer to facilitate selective epitaxial growth (SEG) of the fin bodies on the substrate. For example, the mask layer includes an opening to expose the base layer for SEG of the fin body. In one embodiment, the dielectric mask layer is a SiN layer. Other types of dielectric mask layers may also be useful.

The fin body, in one embodiment, includes a B LED 330, a G LED 340 and a R LED 350 which are configured one above another in a stack. The fin body with the LEDs forms an LED unit. The LED unit may correspond to an LED row unit of the LED pixel. In one embodiment, an LED pixel may include a plurality of LED row units in the row direction which are interconnected in a second or column direction. As shown, the pixel includes 3 rows or LED row units. Providing other number of LED units may also be useful. The number of LED units may depend on, for example, the desired pixel intensity and/or desired pixel resolution. For example, more LED units may be provided to achieve higher pixel intensity.

The B LED, G LED and R LED of an LED unit are stacked in sequence on the fin body. For example, the B LED is the bottom or base LED, the G LED is the intermediate LED and the R LED is the top LED of the stack. The base LED surrounds a lower or base portion of the fin body, the intermediate LED surrounds a mid or intermediate portion of the fin body and the top LED surrounds and covers a top portion of the fin body.

In one embodiment, the stacked LED unit is a non-overlapping stacked LED unit with non-overlapping LEDs. The non-overlapping LEDs of the unit are isolated from each other on the fin body. For example, the base LED is disposed on a lower or base portion of the fin body, the intermediate LED is disposed on a mid or intermediate portion of the fin body and the top LED is disposed on a top portion of the fin body, while the base LED, the intermediate and the top LED are separated from each other. The dimensions of the fin body should be sufficient to accommodate the non-overlapping LEDs. For example, the dimensions of the fin body may have a length of about 1 um, a height of about 4 um and a width of about 200 nm. Other body dimensions may also be useful.

An LED includes a multiple quantum well (MQW) 125 disposed on an LED base layer 131. The base layer may be a GaN base layer. The base layer, in one embodiment, is a p-GaN fin body. As for the MQW, it includes y quantum wells (QWs), where y is ≥2. The MQW may include about 2-6 QWs. In one embodiment, a MQW includes two QWs. Other number of QWs may also be useful. The number of QWs may depend on, for example, the desirable optical efficiency. A QW includes a well layer 132 sandwiched by barrier layers 134. The barrier layer may be served by a barrier layer from a previous or subsequent QW or by an LED base layer.

In one embodiment, the well layer of a QW includes an InGaN layer and the barrier layer includes a GaN layer. The layers of the MQW may be formed by SEG. The GaN barrier layer may be an undoped layer or a layer doped with first or second polarity type dopants. Other barrier layers, for example, metallic layers with wurtzite crystal structure, may also be useful. The thickness of the well layer may be about 3 nm while the thickness of the barrier layer is about 12 nm. Other thicknesses may also be useful. For example, in the case where the barrier layer is served by the body or top LED layer, the thickness of the barrier layer may be thicker. Other configurations of the well and barrier layers may also be useful.

A top LED layer is disposed on the MQW. The top LED layer, in one embodiment, is a second polarity doped GaN top LED layer. For example, in the case of a n-GaN fin, the top LED layer is a p-doped GaN layer. In one embodiment, the fin body serves as a cathode terminal and the top LED layer serves as an anode terminal of the LED.

In one embodiment, the B or base LED is disposed on the base portion of the fin body. The fin body serves as the base layer of the LED. A B MQW is disposed on the fin body. The B MQW includes a first B well layer disposed on the fin body, a first B barrier layer on the first B well layer, a second B well layer on the first B barrier layer and a second B barrier layer on the second B well layer. A top LED layer 138 is disposed on the B MQW. For example, a top B LED layer is disposed on the B MQW. The top LED layer, in one embodiment, is a second polarity doped GaN top LED layer, such as a p-GaN layer. The B MQW and top B LED layer surrounds a base portion of the fin body.

A first metal layer 391 is disposed on the dielectric mask layer 118. The first metal layer, for example, represents M1 of the device. The first metal layer may be an Al layer. Other types of conductive materials, such copper or copper alloy, may also be used as the metal layer. The thickness of the metal layer may be about 0.25 um. Other thicknesses may also be useful. The metal layer, as shown, is coupled to the top LED layer of the B LED. For example, the metal layer is coupled to the anode terminal of the B LED.

A first interlevel dielectric layer 381 is disposed over the first metal layer. The first interlevel dielectric layer may be a silicon oxide layer. Other types of interlevel dielectric layers may also be useful. The dielectric layer has a top surface which defines the bottom of the intermediate LED. For example, the bottom of the intermediate LED is separated from the top of the base LED. A dielectric spacer 360 may define the space or separation between the LEDs. In the case where no dielectric spacers are provided, the first interlevel dielectric layer may fill the space between the LEDs. The interface of the first dielectric layer and top of the first interlevel dielectric layer, for example, defines the interface of the base and intermediate portions of the fin body.

An intermediate or G LED surrounds the intermediate portion of the fin body. The fin body serves as the base layer of the LED. A G MQW is disposed on the fin body. The G MQW includes a first G well layer disposed on the fin body, a first G barrier layer on the first G well layer, a second G well layer on the first G barrier layer and a second G barrier layer on the second G well layer. A top LED layer is disposed on the G MQW. For example, a top G LED layer is disposed on the G MQW. The top G LED layer, in one embodiment, is a second polarity doped GaN top LED layer, such as a p-GaN layer. The G MQW and top G LED layer surrounds the intermediate portion of the fin body.

A second metal layer 393 is disposed on the first interlevel dielectric layer 381. The second metal layer, for example, represents M2 of the device. The second metal layer may be a TCO layer, such as ITO. Other types of TCO materials may also be useful. The second conductive layer may be about 150 nm. Other thicknesses may also be useful. The metal layer, as shown, is coupled to the top LED layer of the G LED. For example, the metal layer is coupled to the anode terminal of the G LED.

A second interlevel dielectric layer 383 is disposed over the second metal layer 393. The second interlevel dielectric layer may be a silicon oxide layer. Other types of interlevel dielectric layers may also be useful. The dielectric layer has a top surface which defines the bottom of the top LED. For example, the top of the intermediate LED is separated from the bottom of the top LED by a space. The separation between the LEDs may be defined by the dielectric spacer 360. In the case where no dielectric spacers are provided, the second interlevel dielectric layer may fill the space between the LEDs. The interface of the top of the second dielectric layer and bottom of the top LED defines the interface of the intermediate and top portions of the fin body.

A top or R LED surrounds and covers the top portion of the fin body. The fin body serves as the base layer of the R LED. A R MQW is disposed on the fin body. The R MQW includes a first R well layer disposed on the fin body, a first R barrier layer on the first R well layer, a second R well layer on the first R barrier layer and a second R barrier layer on the second R well layer. A top LED layer is disposed on the R MQW. For example, a top R LED layer is disposed on the R MQW. The top R LED layer, in one embodiment, is a second polarity doped GaN top LED layer, such as a p-GaN layer. The R MQW and top R LED layer surrounds and covers the top portion of the fin body.

A third metal layer 395 is disposed on the second interlevel dielectric layer 383. The third metal layer, for example, represents M3 of the device. The third metal layer may be a TCO layer, such as ITO. Other types of TCO materials may also be useful. The third conductive layer may be about 150 nm. Other thicknesses may also be useful. The third metal layer, as shown, is coupled to the top LED layer of the R LED. For example, the metal layer is coupled to the anode terminal of the R LED.

A third interlevel dielectric layer 385 is disposed over the third metal layer. The third interlevel dielectric layer may be a silicon oxide layer. Other types of interlevel dielectric layers may also be useful. The dielectric layer has a top surface which defines the top of the LED unit. The interlevel dielectric layers may be collectively an interlevel dielectric layer 380 of the LED unit.

A metal layer includes a contact region 397 to accommodate contacts. For example, M1 includes a M1 contact region for accommodating M1 contacts 392, M2 includes a M2 contact region for accommodating M2 contacts 394 and M3 includes a M3 contact region for accommodating M3 contacts 396. In addition, the doped well 104 may include a well contact region for accommodating well contacts 398. The well contacts serve to couple the base or fin bodies of the LED units.

The contact regions of the different levels, including the well level, extend from different sides of the pixel to provide access without shorting the contacts of different levels with other levels. The contacts may be Al or W contacts. Other types of conductive materials, such as copper or copper alloy may also be useful. As shown, the contacts are via contacts.

In some embodiment, the contacts of a metal level may be configured as a bar contact. The contacts may serve as LED mirrors. The contacts may be coupled to contact pads to provide external access to the LED pixels disposed on a metal or pad level above a top dielectric layer (not shown). Other configurations of contact pads may also be useful.

As discussed, the pixel includes stacked R, G and B LEDs. The different color LEDs have different bandgaps. In one embodiment, the different bandgaps for different color LEDs are achieved by varying the percentage (atomic percentage) of In in the well layers of the MQW. In one embodiment, the percentage of In of the InGaN layer of the well layers of the MQW is varied to achieve different bandgaps for different color LEDs. For example, x defines the percentage of In in the $In_xGa_{1-x}N$ well layer. In one embodiment, the percentage of In for the $In_xGa_{1-x}N$ layer in the MQW may be as follows:

Blue: x=15-20%;

Green: x=25-30%; and

Red: x=35-40%.

Other percentages of In may be useful, as long as the different bandgaps have sufficient separation.

Although the device is shown with one pixel, it is understood that the device may include a plurality of pixels interconnected in the row and column directions to form a matrix of pixels of an LED display. The number of pixels depends on the form factor of the display.

Figure 4A:
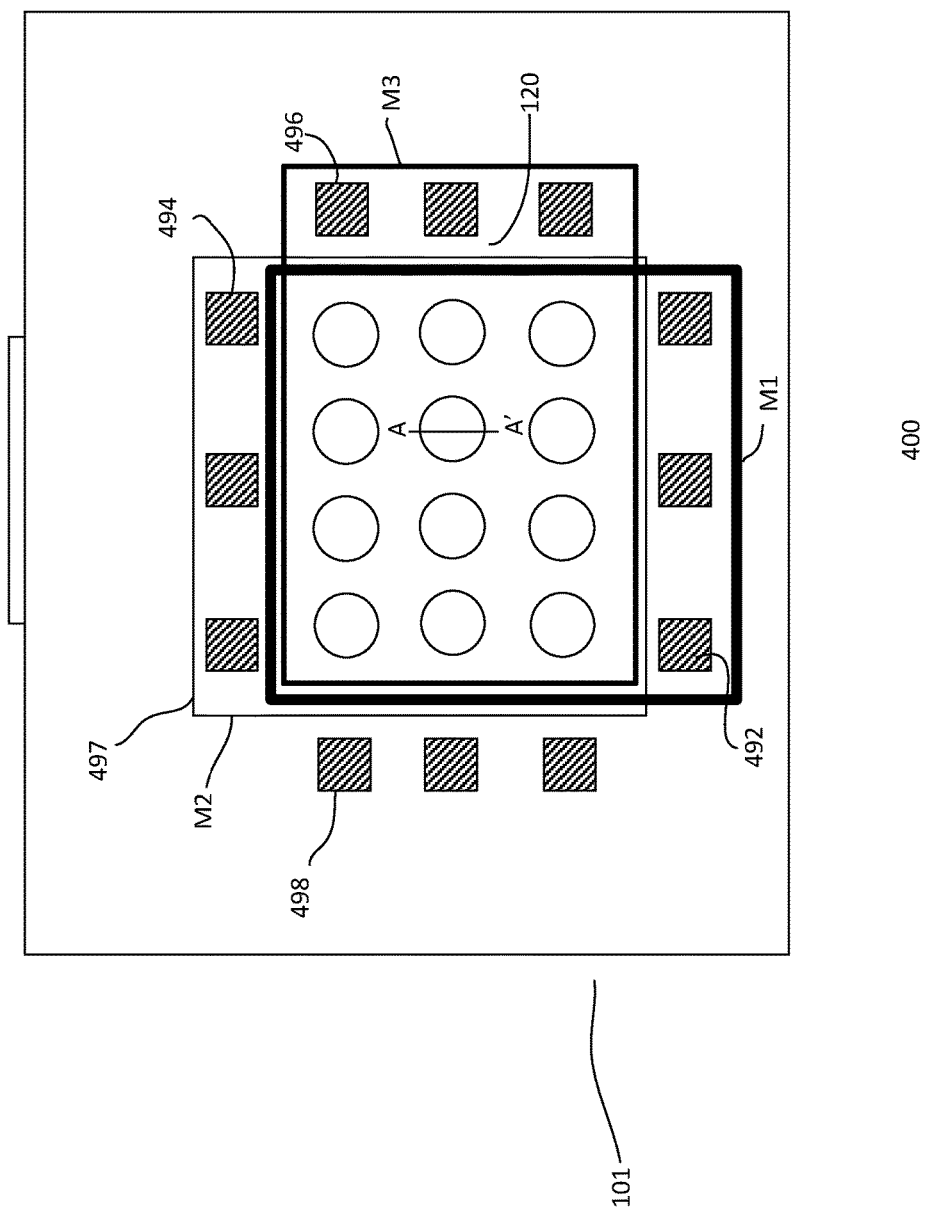
FIGS. 4a-b show top and cross-sectional views of another embodiment of a device.
Figure 4B:
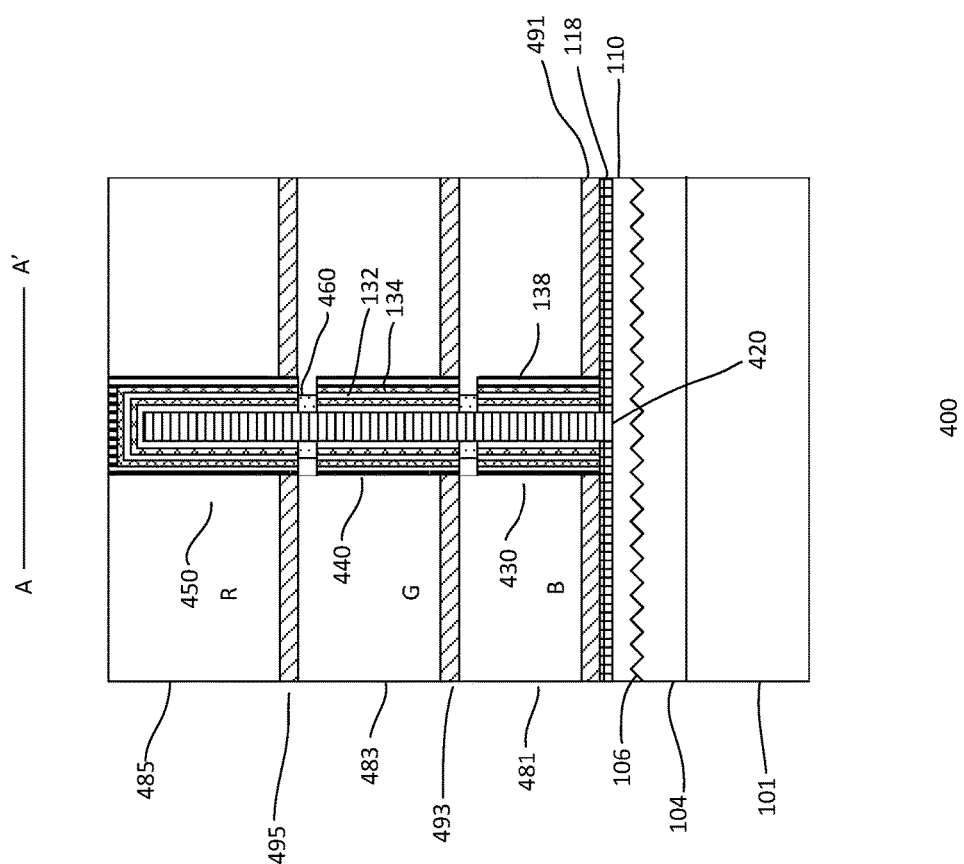

FIGS. 4a-b show top and cross-section views of an embodiment of a device 400. The cross-sectional view is along A-A' of the top view. The device is similar to that described in FIGS. 1a-b, 2a-b and 3a-b. Common elements may not be described or described in detail. Referring to FIGS. 3a-b, the device includes a substrate 101. The substrate may be a bulk semiconductor substrate, such as a silicon (Si) substrate. For example, the substrate may be a Si(111) or Si(100) with grooves to expose the (111) plane. In other embodiments, the substrate may be a silicon carbide (SiC), silicon on insulator (SOI) substrate, or a sapphire substrate.

In one embodiment, the substrate includes a doped device well 104, such as a n+ well. Other types of doped wells may also useful. A base layer 110 may be disposed on the substrate surface. The base layer may be a composite base layer with an AlN nucleation layer and a GaN buffer layer. The base layer includes a planar top surface.

The substrate, as shown, includes a pixel region containing a stacked multi-color LED pixel. In one embodiment, the pixel includes a stacked nanowire multi-color LED. In one embodiment, the LED pixel is a stacked nanowire RGB LED. The stacked nanowire LED includes a nanowire body 220 with non-overlapping R, G and B LEDs 450, 440 and 430, similar to that described in FIGS. 3a-b. The nanowire RGB LED forms an LED unit. In one embodiment, the pixel includes a plurality of LED units arranged in a matrix. For example, the LED units may be arranged in m rows and n columns of LED units. As shown, the pixel includes a 3×4 matrix of LED units (3 rows and 4 columns). Providing other number of rows and columns for the matrix, including 1, may also be useful. For example, the pixel may include 1 LED unit. The number of LED units may depend on, for example, the desired pixel intensity and/or the desired pixel resolution.

The nanowire body serves as a base of the non-overlapping LEDs. The nanowire body may be an elongated member having a circular cross-sectional shape disposed on the substrate. Providing other cross-sectional shaped nanowire bodies may also be useful. The nanowire body extends from the substrate in a direction perpendicular to its surface. The nanowire body has a height sufficient to accommodate the non-overlapping LEDs. In one embodiment, the nanowire body has a height of about 4 um and a diameter of about 200 nm. Other nanowire body dimensions may also be useful. In one embodiment, sides of the nanowire body extending from the substrate surface are along a m-plane while the top of the body is along a c-plane.

An LED includes a multiple quantum well (MQW) 125 disposed on an LED base layer 131. The base layer may be a GaN base layer. The base layer, in one embodiment, is a p-GaN nanowire body. As for the MQW, it includes y quantum wells (QWs), where y is ≥2. The MQW may include about 2-6 QWs. In one embodiment, a MQW includes two QWs. Other number of QWs may also be useful. The number of QWs may depend on, for example, the desirable optical efficiency. A QW includes a well layer 132 sandwiched by barrier layers 134. The barrier layer may be served by a barrier layer from a previous or subsequent QW or by an LED base layer. A top LED layer 138, such as p-GaN layer, is disposed on the MQW. In one embodiment, the body serves as a cathode terminal and the top LED layer serves as an anode terminal of an LED.

In one embodiment, the B LED surrounds a base portion of the body, a G LED surrounds an intermediate portion of the body and a R LED surrounds and covers a top portion of the body. The non-overlapping LEDs are separated from each other on the body. A spacer 460, such as a SiN spacer may be used to separate the LEDs form each other. Alternatively, or in addition to the spacer, an interlevel dielectric layer may be used to separate the LEDs.

For example, a first interlevel dielectric layer 481 is disposed on a first metal layer 491 which represents M1, a second interlevel dielectric layer 483 is disposed on a second metal layer 493 which represents M2 and a third interlevel dielectric layer 485 disposed on a third metal layer 495 which represents M3. As shown, the first metal layer 491 is disposed on the dielectric mask layer 118, the second metal layer 493 is disposed on the top of the first interlevel dielectric layer 481 and the third metal layer 495 is disposed on the top of the second interlevel dielectric layer 483. The first metal layer is coupled to the top LED layer of the B LED, the second metal layer is coupled to the top LED layer of the G LED and the third metal layer is coupled to the top LED layer of the R LED.

A metal layer includes a contact region 497 to accommodate contacts. For example, M1 includes a M1 contact region for accommodating M1 contacts 492, M2 includes a M2 contact region for accommodating M2 contacts 494 and M3 includes a M3 contact region for accommodating M3 contacts 496. In addition, the doped well 104 may include a well contact region for accommodating well contacts 498. The well contacts serve to couple the base or bodies of the LED units.

The contact regions of the different levels, including the well level, extend from different sides of the pixel to provide access without shorting the contacts of different levels with other levels. The contacts may be Al or W contacts. Other types of conductive materials, such as copper or copper alloy, may also be useful. As shown, the contacts are via contacts. In some embodiment, the contacts of a metal level may be configured as a bar contact. The contacts may serve as LED mirrors. The contacts may be coupled to contact pads to provide external access to the LED pixels disposed on a metal or pad level above a top dielectric layer (not shown). Other configurations of contact pads may also be useful.

As discussed, the pixel includes stacked R, G and B LEDs. The different color LEDs have different bandgaps. In one embodiment, the different bandgaps for different color LEDs are achieved by varying the percentage (atomic percentage) of In in the well layers of the MQW. In one embodiment, the percentage of In of the InGaN layer of the well layers of the MQW is varied to achieve different bandgaps for different color LEDs. For example, x defines the percentage of In in the $In_xGa_{1-x}N$ well layer. In one embodiment, the percentage of In for the $In_xGa_{1-x}N$ layer in the MQW may be as follows:

Blue: x=15-20%;

Green: x=25-30%; and

Red: x=35-40%.

Other percentages of In may be useful, as long as the different bandgaps have sufficient separation.

The width of the LEDs depends on the In percentage in the $In_xGa_{1-x}N$ well layer. Epi loading effects cause In atoms diffuse from the nanowire body into the growing crystal. In one embodiment, the width of a B LED is greater than about 300 nm, the width of a G LED is about 200 nm, and the width of a R LED is less than about 100 nm. For example, a R LED has a higher In percentage in the $In_xGa_{1-x}N$ well layer and therefore it has a shorter LED width. Other widths for the different LEDs may also be useful.

Although the device is shown with one pixel, it is understood that the device may include a plurality of pixels interconnected in the row and column directions to form a matrix of pixels of an LED display. The number of pixels depends on the form factor of the display.

FIGS. 5a-j show cross-sectional views of an embodiment of a process for forming a device 500. The device, for example, is similar to that described in FIGS. 1a-b, 2a-b, 3a-b and 4a-b. Common elements may not be described or described in detail. In one embodiment, the process describes forming a fin-type multi-color LED with overlapping LEDs.

Figure 5A:
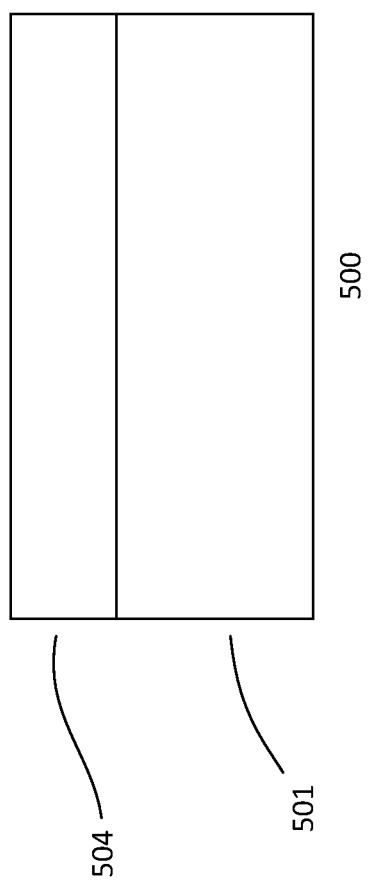
FIGS. 5a-j show cross-sectional views of a process for forming a device.

Referring to FIG. 5a, a substrate 501 is provided. The substrate may be a bulk semiconductor substrate, such as a silicon (Si) substrate. In one embodiment, the substrate is a Si(111) substrate. Alternatively, the substrate may be a Si(100) substrate. In other embodiments, the substrate may be a silicon carbide (SiC), silicon on insulator (SOI) substrate, or a sapphire substrate.

In one embodiment, the substrate is prepared with a device well 504. The device well is a doped well. The doped well, for example, extends from the surface of the substrate to a depth of about 0.5 nm. The doped device well may be heavily doped with first polarity type dopants. In one embodiment, the doped device well is a heavily doped n-type (n$^+$) device well. The device well may be formed by implanting first polarity type dopants. An implant mask or a blanket implant may be used to implant the first polarity type dopants. For example, the implant mask exposed the cell region in which dopants are to be implanted. An anneal is performed after forming the device wells. The anneal activates the dopants.

Figure 5B:
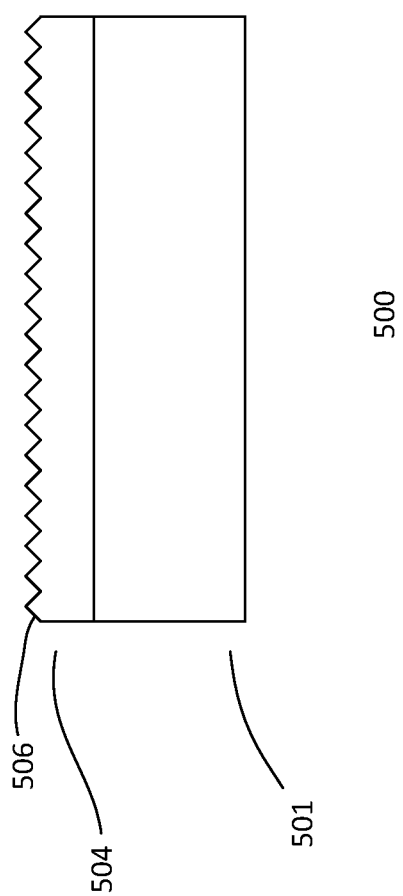

In the case of a Si(100) substrate, as shown in FIG. 5b, it may be processed to form V-grooves 506 to expose the (111) surface in the Si(100) substrate. The V-grooves may be formed by an anisotropic etch, such as a wet etch. The anisotropic etch employs an alkaline etch solution, such as tetramethylammonium hydroxide (TMAH) or potassium hydroxide (KOH). Alternatively, an isotropic etch, such as a reactive ion etch (RIE) may be employed.

Figure 5C:
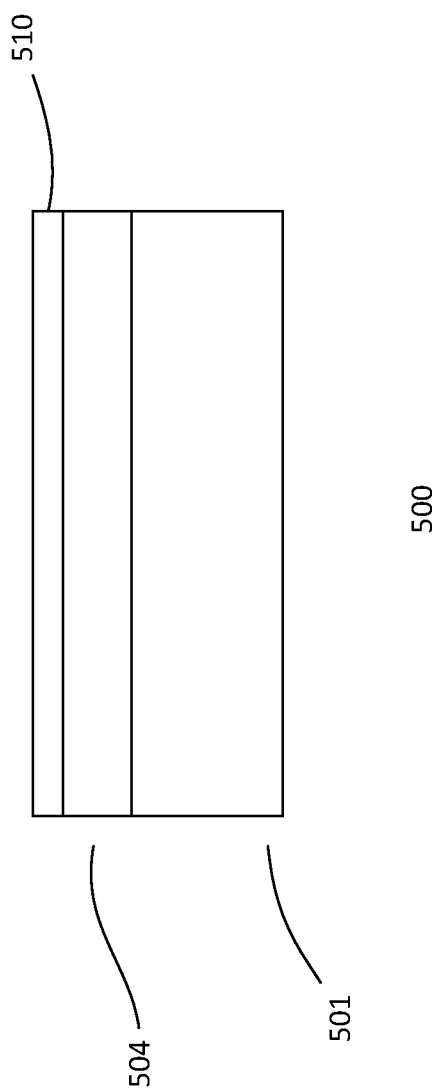

As shown in FIG. 5c, a base layer 510 is formed over the substrate. The base layer may be a composite base layer having multiple layers. In one embodiment, the base layer includes a nucleation layer and a buffer layer. The nucleation layer is disposed on the substrate and the buffer layer is disposed on the nucleation layer. The nucleation layer may be an AlN layer and the buffer layer may be a GaN layer. The layers may be formed by metalorganic chemical vapour deposition (MOCVD) or molecular beam epitaxy (MBE) growth process. Other forming or deposition techniques may also be useful. The thickness of the nucleation layer may be about 50-200 nm while the buffer layer may be about 0.5-2 um. Other thicknesses for the nucleation and buffer layers may also be useful. In the case of grooves on the top surface of the substrate, the base layer may be planarized to form a planar surface. For example, a chemical mechanical polish (CMP) may be performed to form a planar top surface. This results in the second base layer having a planar top surface. Alternatively, the second base layer is planarized to form a planar top surface.

Figure 5D:
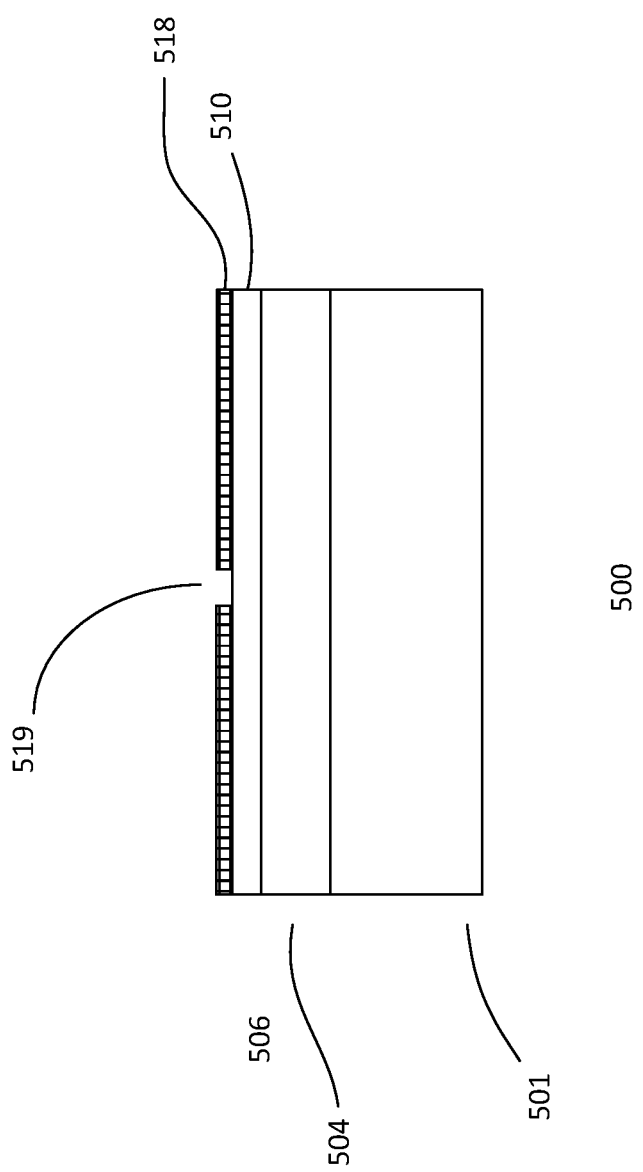

In FIG. 5d, a dielectric mask layer 518 is formed on the substrate. The dielectric mask layer, in one embodiment, is a SiN layer. The mask layer may be formed by, for example, CVD. The mask layer is patterned to form an opening 519 corresponding to where a fin body is to be formed. To pattern the mask layer, mask and etch techniques may be used. For example, a soft mask, such as a photoresist mask, may be formed over the mask layer. An exposure source may selectively expose the photoresist layer through a reticle containing the desired pattern. After selectively exposing the photoresist layer, it is developed to form openings corresponding to the location where the opening 519 in the mask layer 518 is to be formed. To improve lithographic resolution, an anti-reflective coating (ARC) may be used below the photoresist layer.

The patterned photoresist layer serves as an etch mask for an etch process. For example, the etch transfers the pattern of the photoresist mask to the mask layer 518. The etch removes the mask layer unprotected by the photoresist mask, exposing the base layer below. The etch, for example, may be an anisotropic etch, such as reactive ion etch (RIE). Other types of etch processes may also be useful. After patterning the mask layer, the photoresist etch mask is removed, for example, by ashing. Other techniques for removing the photoresist mask may also be useful.

Figure 5E:
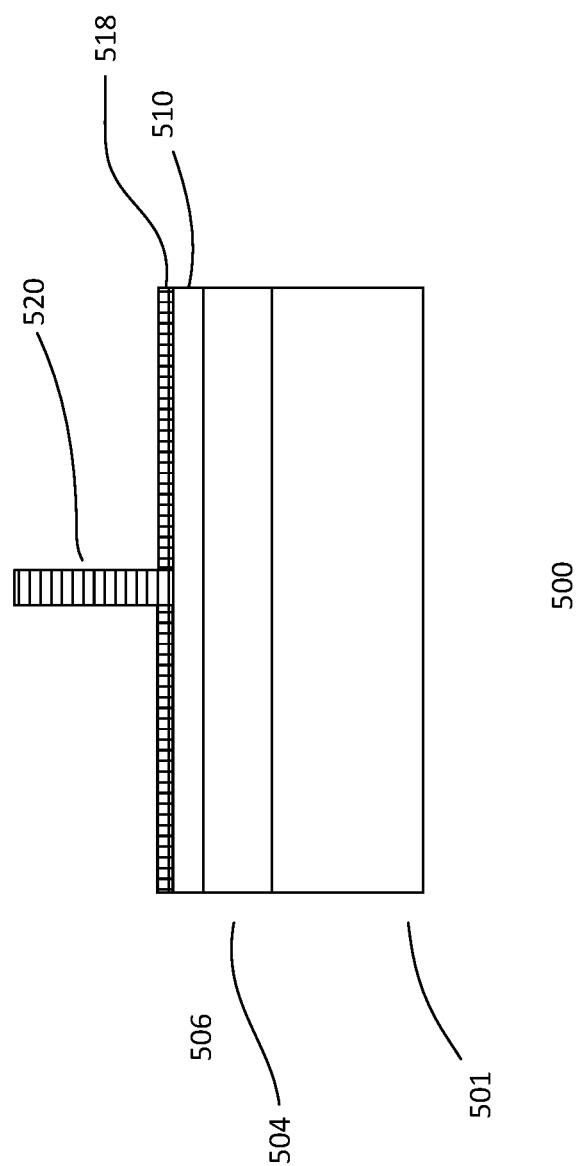

As shown in FIG. 5e, a fin body 520 is formed on the substrate. In one embodiment, the fin body is formed in the opening 519 in the mask layer 518. The fin body is a GaN body formed by SEG. In one embodiment, a fin body is a first polarity type doped GaN fin body. In one embodiment, the fin body is n-GaN fin body. Doping the fin body may be achieved by in-situ doping during epitaxial growth or by ion implantation after formation.

Although one fin body is shown, it is understood that a pixel may include a plurality of fin bodies. For example, the fin bodies are disposed along in a row direction and interconnected in the column direction. Furthermore, the substrate may include a plurality of pixels arranged in rows and columns to form a display.

Figure 5F:
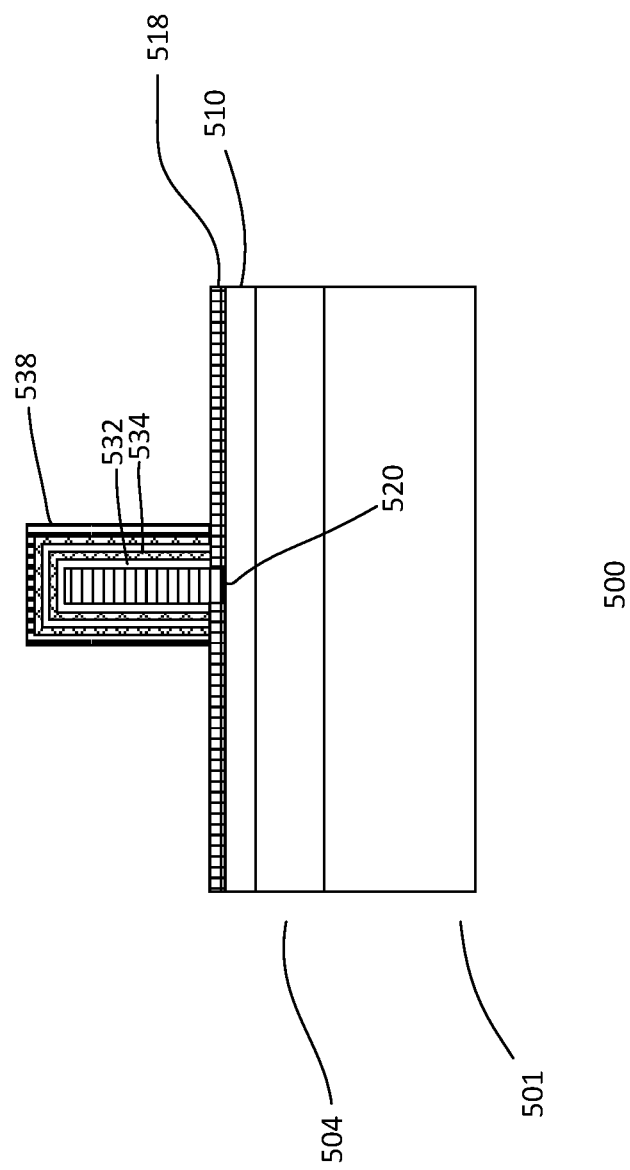

In FIG. 5f, the process proceeds to form a MQW of base LED. For example, the process forms a B MQW for the B LED. As previously discussed, a QW of the MQW includes a well layer sandwiched between two barrier layers. In one embodiment, the MQW includes two QWs. Forming other number of QWs for the MQW may also be useful. As shown, a first well layer 532 is formed over the exposed B LED region of the fin body. A first barrier layer 534 is formed over the first well layer. In one embodiment, the first well layer is an InGaN layer and the first barrier layer is a GaN layer. The fin body serves as a barrier layer. The fin body and the first barrier layer sandwiches the first well layer to form the first QW. A second well layer, such as an InGaN and a second barrier layer, such as GaN, are formed over the first QW. The first barrier layer, the second well layer and the second barrier layer serve as the second QW. As such, the MQW includes alternating layers of InGaN and GaN layers disposed over the exposed fin body.

In one embodiment, the layers of the B MQW are formed by SEG. For example, the layers of the MQW are selectively formed on the fin body. The mask layer prevents the formation of the MQW layers except on the fin body or over another MQW layer. In one embodiment, the first InGaN layer is selectively formed on the fin body. The GaN layer is selectively formed on the InGaN layer. For an additional MQW layer, it is formed on an underlying MQW layer. The thickness of the InGaN layer may be about 3 nm and the GaN layer may be about 12 nm. Other thicknesses may also be useful.

As discussed, the InGaN layer of a B LED has a B bandgap. In one embodiment, an atomic percentage (x) of Indium of the $In_xGa_{1-x}N$ layers of the B MQW is about 15-20%. Providing other atomic percentages of In in the InGaN layer may also be useful.

In one embodiment, a top LED layer 538 is formed on the B MQW. Disposed between the top LED layer and the B MQW is an EBL (not shown), such as an undoped GaN or AlGaN layer. The top LED layer, in one embodiment, is a second polarity doped GaN top LED layer, such as a p-GaN layer. The top LED layer may be formed by SEG. Doping the top LED layer may be achieved by in-situ doping during SEG or by ion implantation after formation.

Figure 5G:
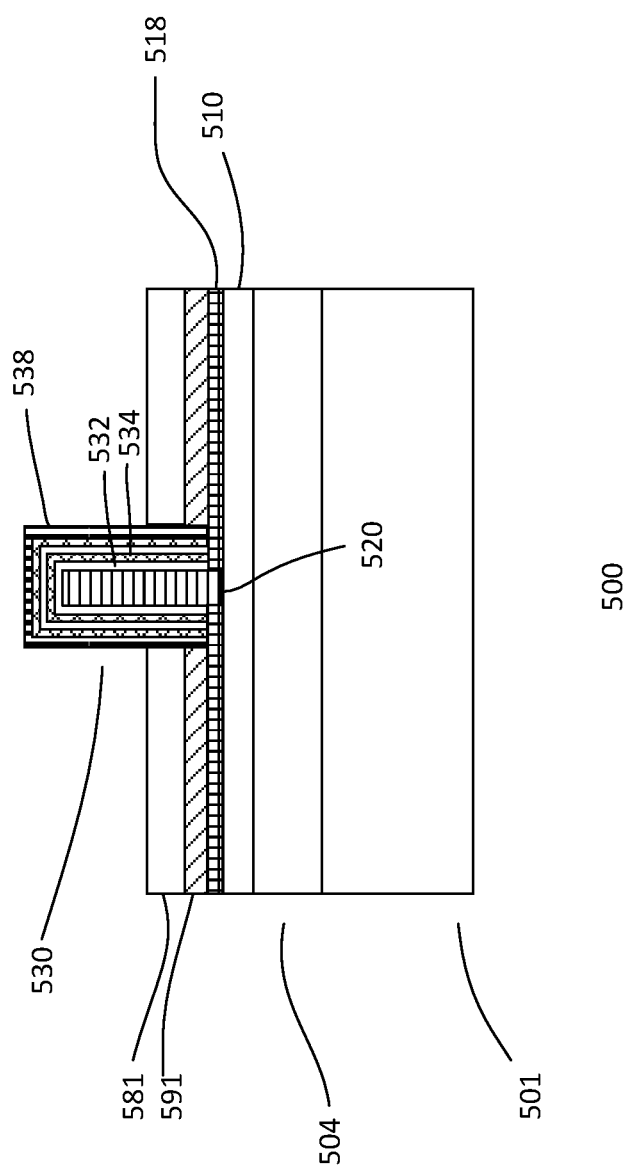

Referring to FIG. 5g, a first metal layer 591 is formed on the substrate. The first metal layer represents M1 of the device. The first metal layer is formed on the mask layer 518. The first metal layer, for example, represents M1 of the device. The first metal layer may be an Al layer. Other types of conductive materials, such W, copper or copper alloy, may also be used as the metal layer. The thickness of the metal layer may be about 0.25 um. Other thicknesses may also be useful. The metal layer, as shown, is coupled to the top LED layer of the B LED.

The metal layer may be formed by sputtering. Other techniques for forming the metal layer may also be useful metal layer fills the gaps and covers the B LED. A planarizing process, such as chemical mechanical polish (CMP) may be performed to remove excess metal material and form a planar top surface between the metal layer and top of the B LED. An etch back process, such as a reactive ion etch (RIE) or wet etch, is performed to recess the metal layer to a desired depth. Other types of etch back processes may also be useful. The etch back process is selective to the top LED layer.

A first interlevel dielectric layer 581 is disposed formed over the first metal layer 591. The first interlevel dielectric layer may be a silicon oxide layer. Other types of interlevel dielectric layers may also be useful. The dielectric layer is formed by, for example, chemical vapor deposition (CVD). Other techniques may also be useful to form the dielectric layer. The dielectric layer fills the gaps and covers the B LED. A CMP may be performed to form a planar top surface between the dielectric layer and top of the B LED. An etch back process, such as RIE, is performed to recess the dielectric layer to a desired depth. The etch back exposes an upper portion of the B LED. For example, the top B LED layer covering the upper portion of the B LED is exposed by the etch back process.

Figure 5H:
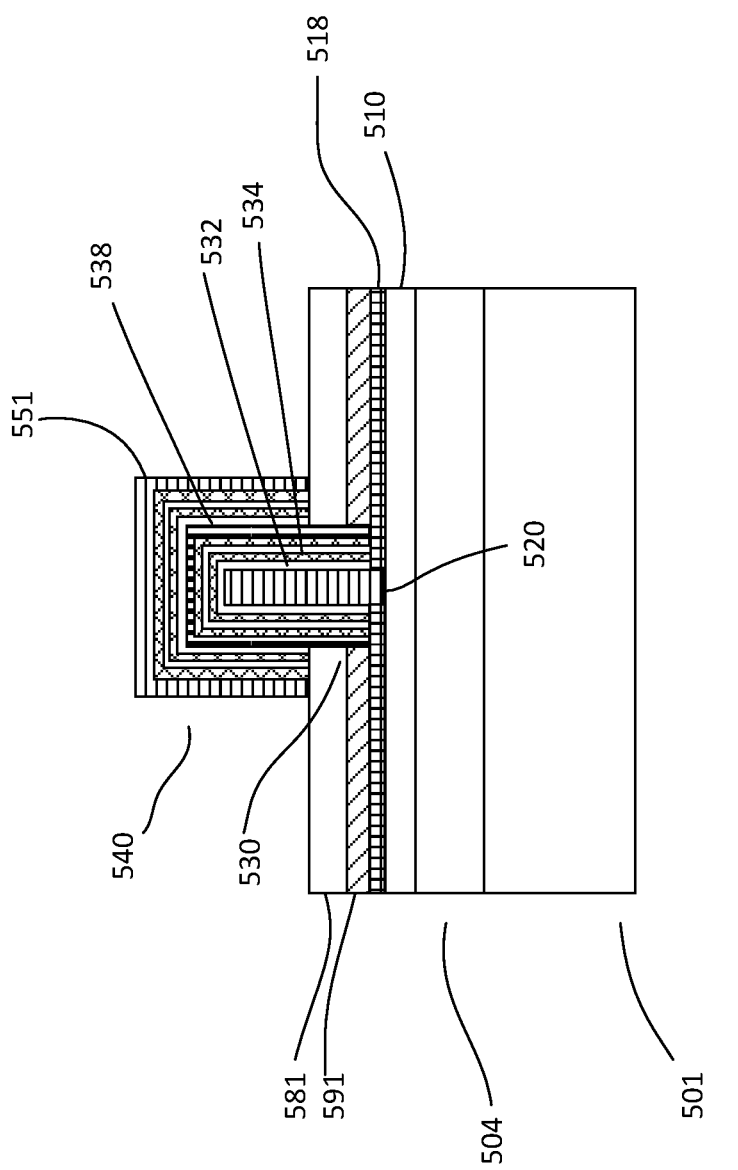

Referring to FIG. 5h, the intermediate LED 540 is formed on the exposed top B LED layer. In one embodiment, a G LED is formed on the exposed top B LED layer. The top B LED layer serves as a common cathode terminal for the B and G LEDs. Forming the G LED includes forming a G MQW on the top B LED layer. Forming the G MQW, in one embodiment, includes sequentially forming an EBL, a first G barrier layer (GaN), a first well layer (InGaN), a second G barrier layer (GaN) and a second well layer (InGaN) on the exposed top B LED layer. In one embodiment, a base layer 551 of the G LED is formed on the G MQW. The G LED base is, for example, a n-GaN base layer. The various layers may be formed by SEG, MOCVD or MBE. Other forming techniques may also be useful. In one embodiment, the base layer serves as a common base for the G and R LEDs. For example, the G and R LEDs share a common cathode terminal.

As discussed, the InGaN layer of a G LED has a G bandgap. In one embodiment, an atomic percentage (x) of Indium of the $In_xGa_{1-x}N$ layers of the G MQW is about 25-30%. Providing other atomic percentages of In in the InGaN layers may also be useful.

Figure 5I:
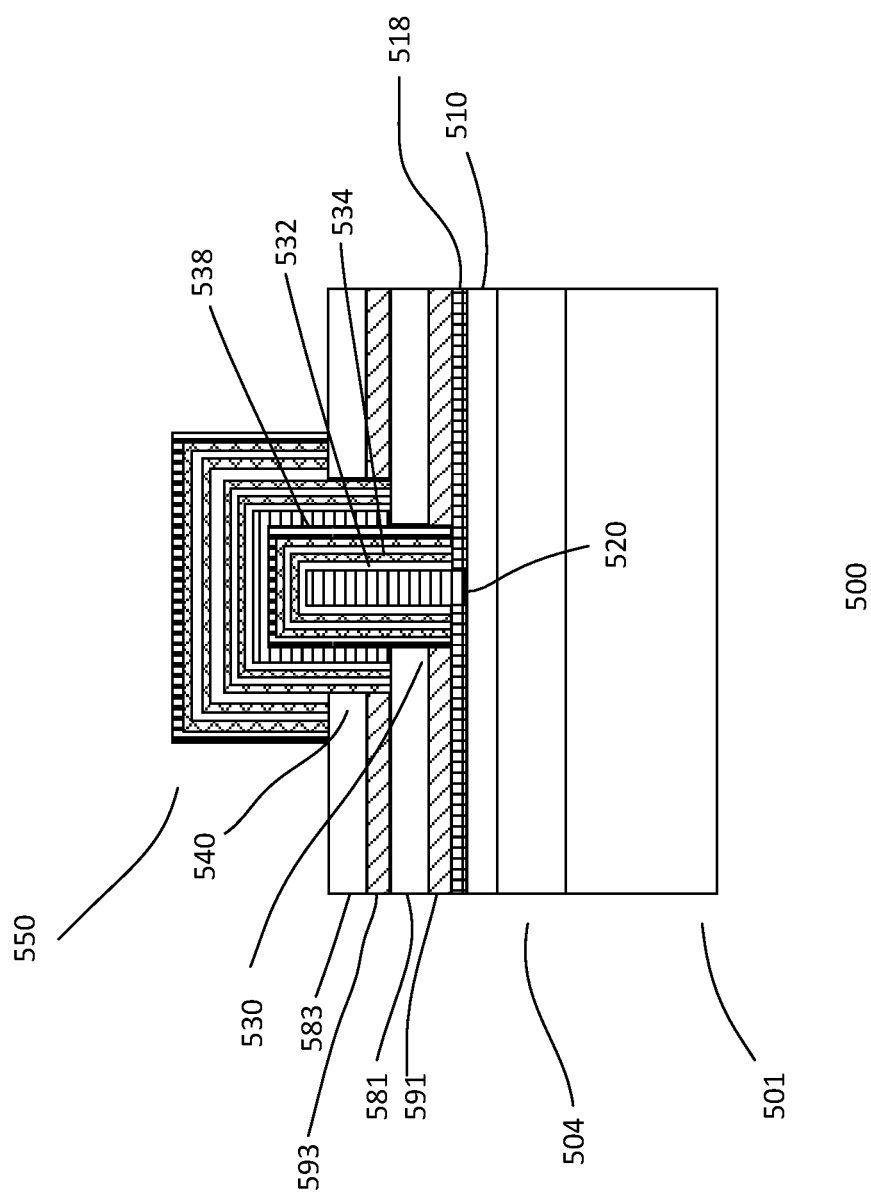

In FIG. 5i, a second metal layer 593 and a second interlevel dielectric layer 583 are sequentially formed over the first interlevel dielectric layer 581. In one embodiment, the second metal layer is a TCO, such as ITO while the second interlevel dielectric layer is a silicon oxide layer. The second metal layer and the second interlevel dielectric layer may be formed similar to the process described in forming the first metal layer and the first interlevel dielectric layer. The second metal layer contacts the G LED base. In one embodiment, the G LED base serves as a common LED base for the G and R LEDs. For example, the G and R LEDs share a common cathode terminal.

Figure 5J:
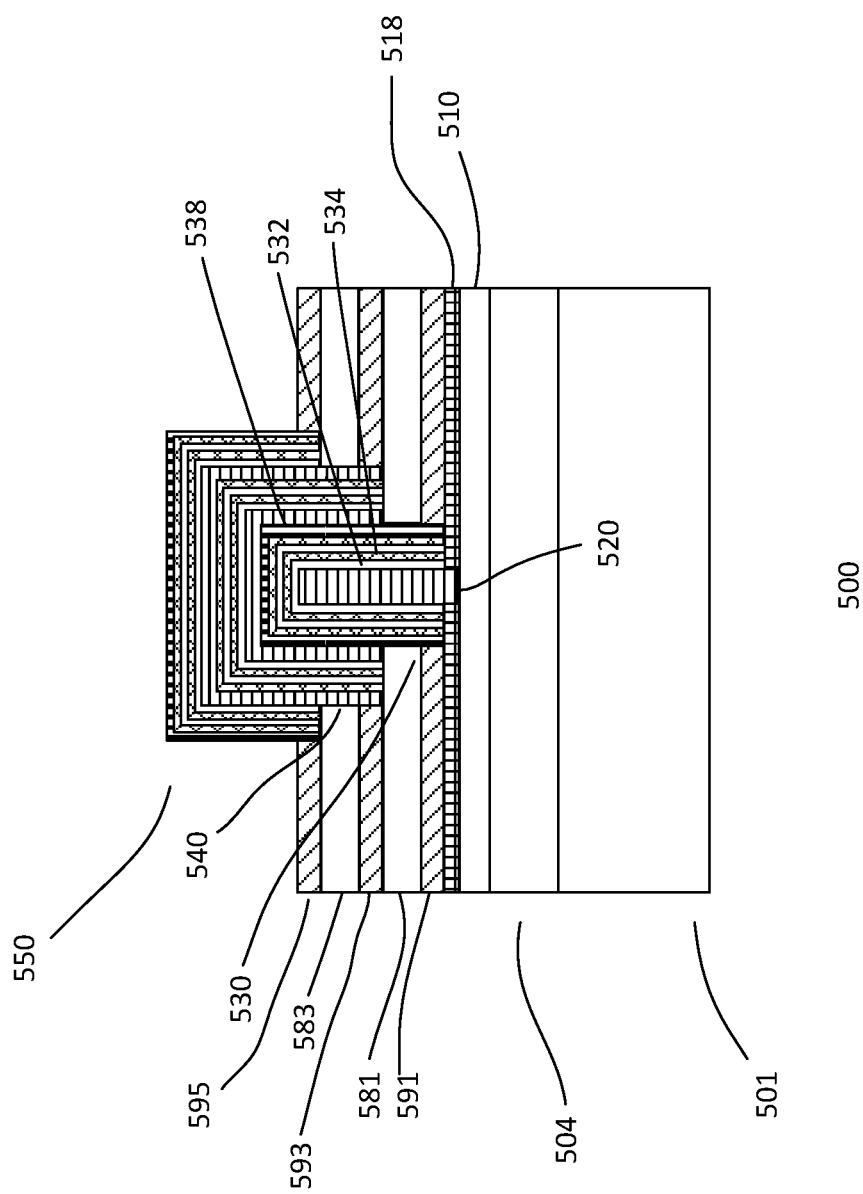

In FIG. 5j, the process proceeds to continue forming the top LED 550 on the exposed portion of the G LED base layer. In one embodiment, a R MQW is formed on the exposed G LED base layer followed by a top LED layer of the R LED. An EBL may be formed on the R MWQ before forming the top LED layer. As discussed, the InGaN layer of a R LED has a R bandgap. In one embodiment, an atomic percentage (x) of Indium of the $In_xGa_{1-x}N$ layers of the G MQW is about 35-40%. Providing other atomic percentages of In in the InGaN layers may also be useful.

A third metal layer 595 is formed on the second interlevel dielectric layer 583. In one embodiment, the third metal layer is a TCO, such as ITO. In one embodiment, a third interlevel dielectric layer (not shown) may be formed over the third metal layer. The third dielectric layer, for example, is a silicon oxide layer. The third metal layer and the third interlevel dielectric layer may be formed similar to the process described in forming the underlying metal and interlevel dielectric layers. In one embodiment, the third interlevel dielectric layer may be planarized to form a planar top surface over the top LED. The planar top surface may be coplanar with the top LED of the stack or above the top LED.

The process, as described, forms a stacked fin-type multi-color LED with overlapping LEDs. The process can be modified to form a stacked nanowire multi-color LED with overlapping LEDs. Standard BEOL processes, for example, passivation, are followed to complete the LED chip routing to achieve the desired functionality.

FIGS. 6a-h show cross-sectional views of an embodiment of a process for forming a device 600. The device, for example, is similar to that described in FIGS. 1a-b, 2a-b, 3a-b, 4a-b and 5a-j. Common elements may not be described or described in detail. In one embodiment, the process describes forming fin-type multi-color LEDs with non-overlapping LEDs.

Figure 6A:
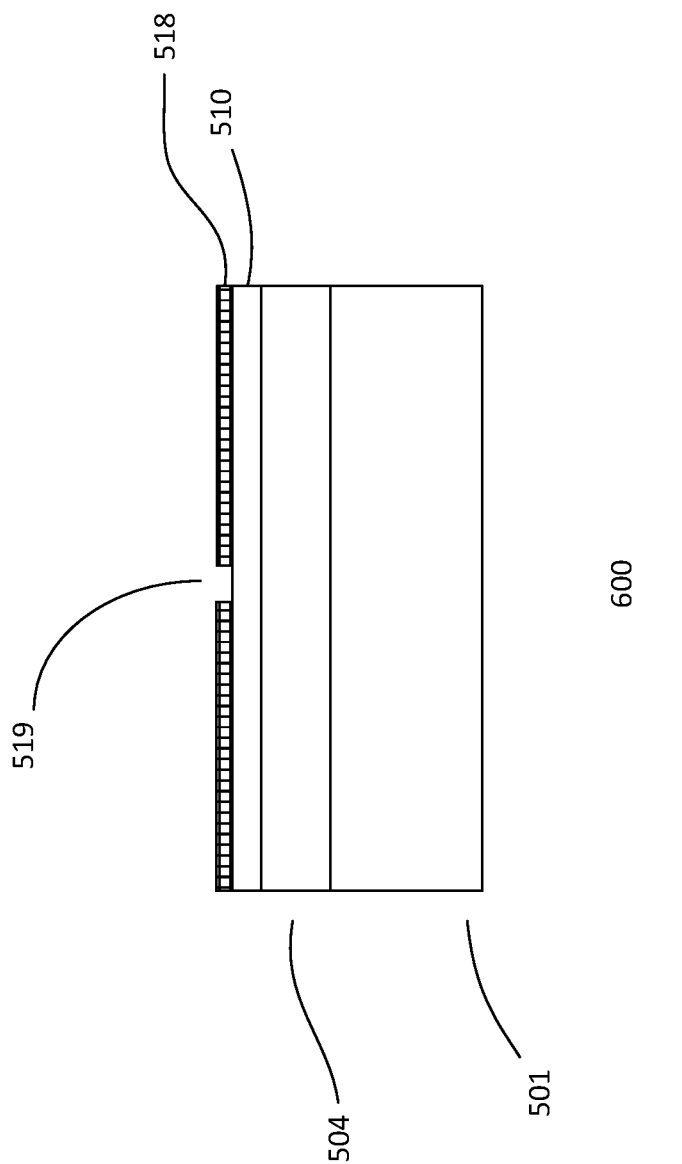
FIGS. 6a-g show cross-sectional views of another process for forming a device.

Referring to FIG. 6a, a substrate 601 is provided. The substrate may be a bulk semiconductor substrate, such as a silicon (Si) substrate. In one embodiment, the substrate is a Si(111) substrate. Alternatively, the substrate may be a Si(100) substrate. In other embodiments, the substrate may be a silicon carbide (SiC), silicon on insulator (SOI) substrate, or a sapphire substrate.

As shown, the substrate is processed to the stage shown in FIG. 6a. For example, the substrate is prepared with a device well 504, such as a n+ well and a base layer 510. A patterned mask layer 518, such as a SiN layer, is formed on the substrate. The mask layer includes openings 519 exposing the base layer where a fin body is to be formed.

Figure 6B:
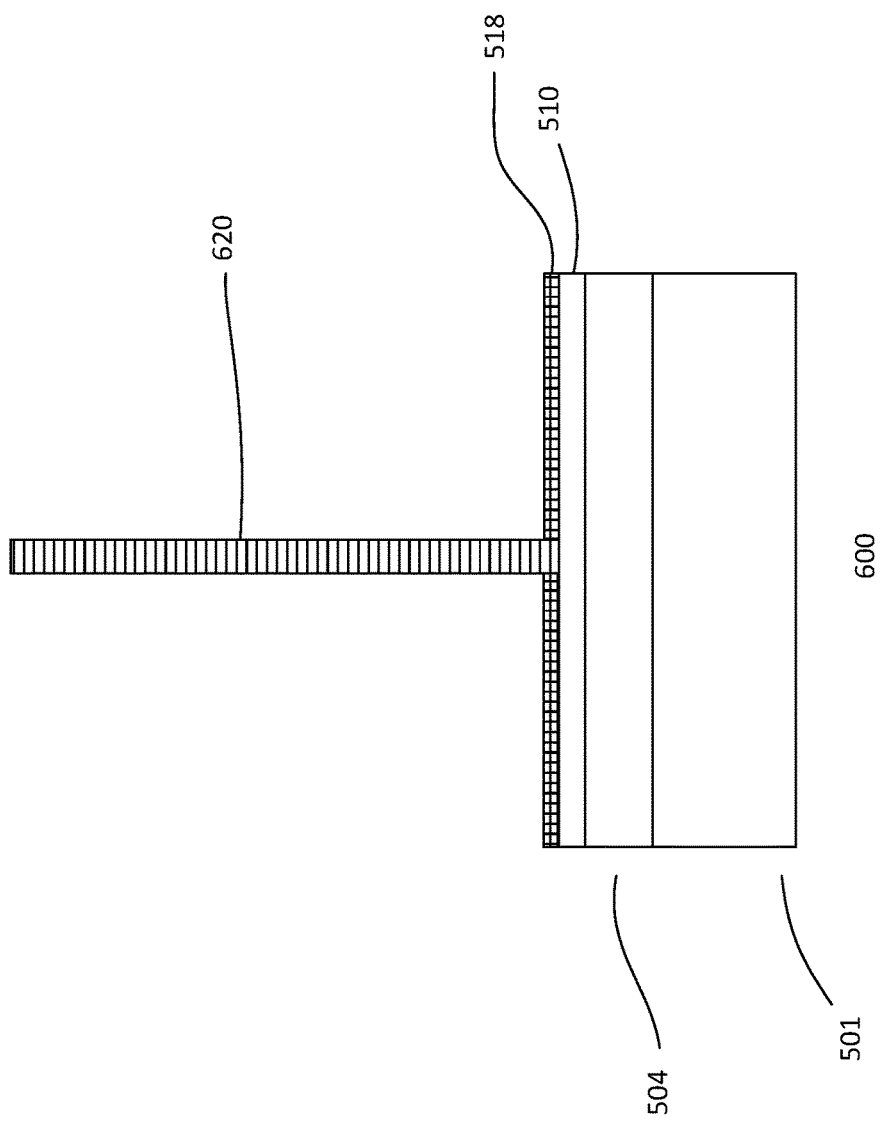

As shown in FIG. 6b, a fin body 620 is formed on the substrate. In one embodiment, the fin body is formed in the opening 519 in the mask layer. The fin body is a GaN body formed by SEG. In one embodiment, a fin body is a first polarity type doped GaN fin body. In one embodiment, the fin body is n-GaN fin body. Doping the fin body may be achieved by in-situ doping during epitaxial growth or by ion implantation after formation. The fin body should have a sufficient height to accommodate non-overlapping R, G and B LEDs.

Although one fin body is shown, it is understood that a pixel may include a plurality of fin bodies. For example, the fin bodies are disposed along in a row direction and interconnected in the column direction. Furthermore, the substrate may include a plurality of pixels arranged in rows and columns to form a display.

Figure 6C:
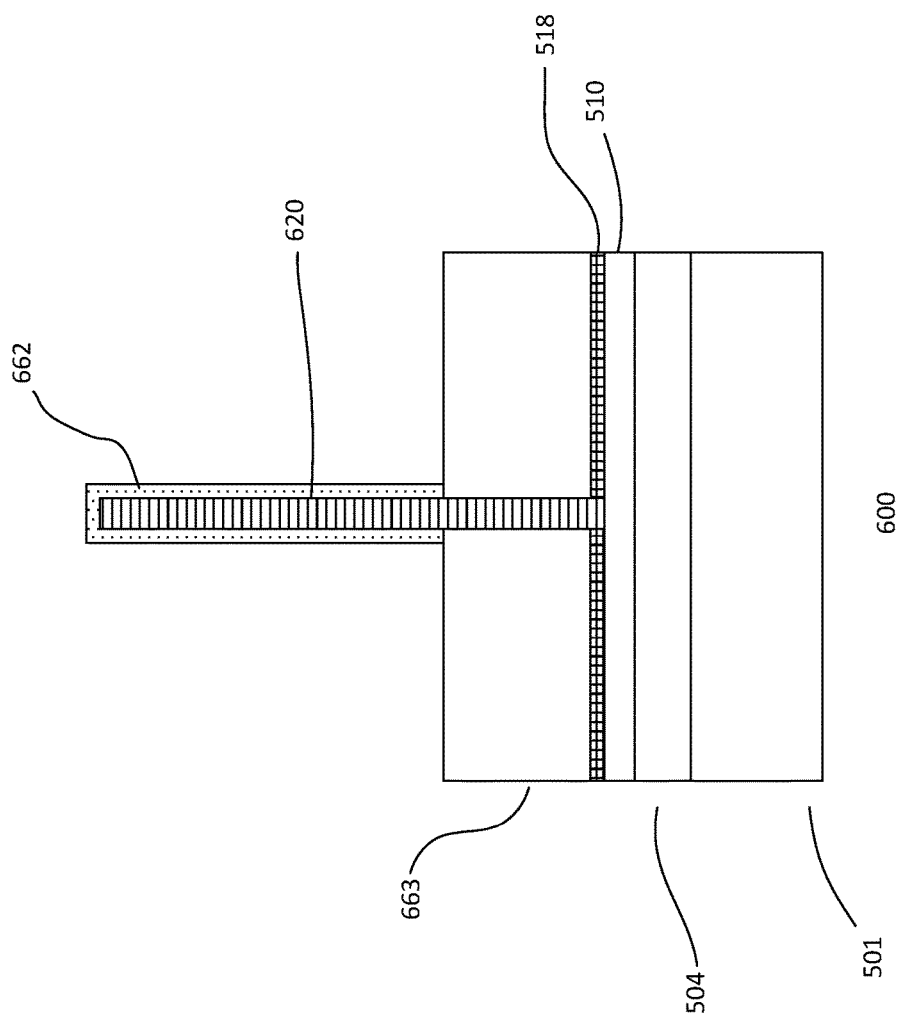

In FIG. 6c, the process proceeds to prepare the fin body to form a base LED. In one embodiment, a first sacrificial dielectric layer 663 is formed on the substrate. The sacrificial dielectric layer, in one embodiment, is a silicon oxide layer. The sacrificial layer may be formed by CVD. The sacrificial layer fills the gaps and covers the fin body. Excess dielectric material may be removed by CMP. An etch back process, such as RIE, may be performed to recess the sacrificial dielectric layer to a depth which is equal to a height of the base LED. Other types of etch back processes may also be useful.

A first protective liner 662 is formed on the exposed portions of the fin body. Other types of protective liners or forming techniques may also be useful. Providing the liner with various thicknesses may be useful. The liner may be a SiN liner which is formed by CVD. The liner lines the substrate and fin body. Mask and etch technique may be employed to pattern the liner layer. For example, a photoresist layer is formed on the substrate and exposed with an exposure source using a reticle or mask with the desired pattern. The photoresist is developed leaving it to protect the liner over the fin body. An etch, such as RIE, is employed to removed unprotected portions of the liner layer, leaving it lining the exposed portion of the fin body.

Figure 6D:
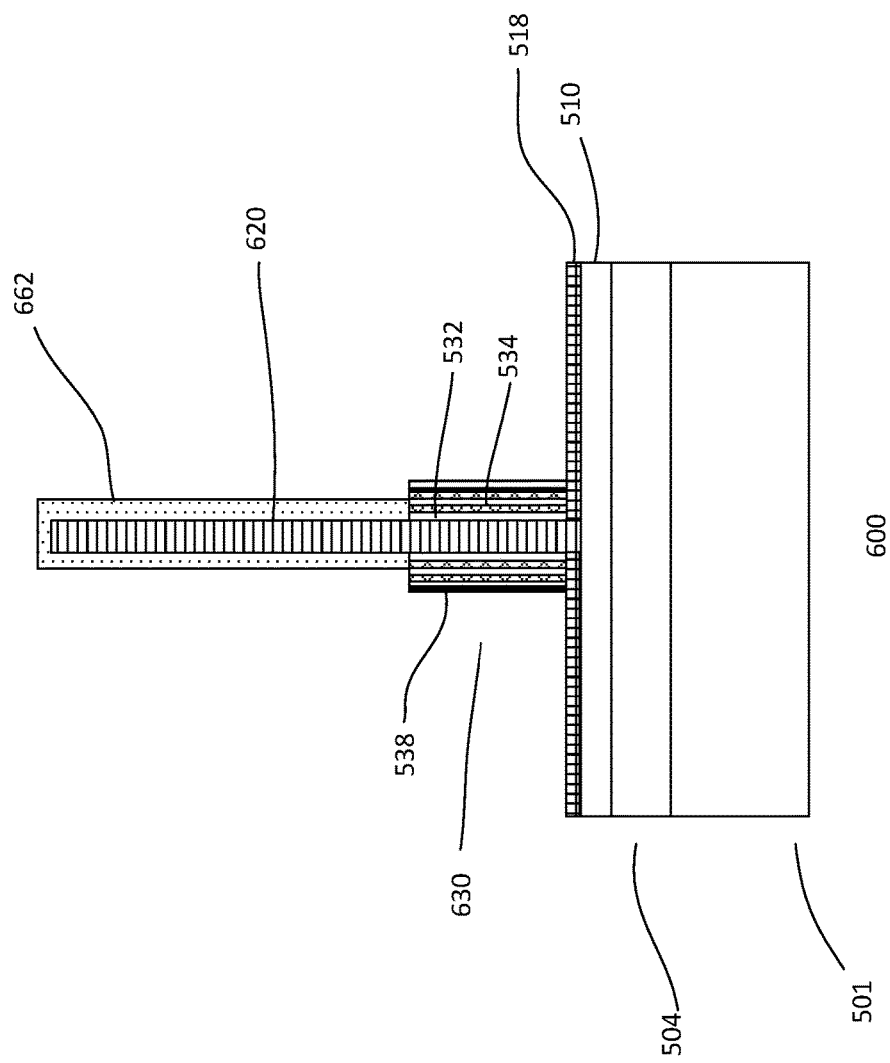

Referring to FIG. 6d, the remaining first sacrificial layer is removed. The sacrificial layer may be removed by a wet etch. The etch, for example, is selective to the protective liner and fin body. Other techniques for removing the sacrificial layer may also be useful. Removing the sacrificial layer exposes the base portion of the fin body.

In one embodiment, the process continues to form a B LED 630 on the exposed portion of the fin body. For example, the process commences to form a B MQW for the B LED. As previously discussed, a QW of the MQW includes a well layer sandwiched between two barrier layers. In one embodiment, the MQW includes two QWs. Forming other number of QWs for the MQW may also be useful. As shown, a first well layer 532 is formed over the exposed B LED region of the fin body. A first barrier layer 534 is formed over the first well layer. In one embodiment, the first well layer is an InGaN layer and the first barrier layer is a GaN layer. The fin body serves as a barrier layer. The fin body and the first barrier layer sandwiches the first well layer to form the first QW. A second well layer, such as an InGaN and a second barrier layer, such as GaN, are formed over the first QW. The first barrier layer, the second well layer and the second barrier layer serve as the second QW. As such, the MQW includes alternating layers of InGaN and GaN layers disposed over the exposed fin body.

In one embodiment, the layers of the B MQW are formed by SEG. Other techniques, such as MOCVD or MBE, may also be useful. For example, the layers of the MQW are selectively formed on the fin body. The mask layer prevents the formation of the MQW layers except on the fin body or over another MQW layer. In one embodiment, the first InGaN layer is selectively formed on the fin body. The GaN layer is selectively formed on the first InGaN layer. For an additional MQW layer, it is formed on an underlying MQW layer. The thickness of the InGaN layer may be about 3 nm and the GaN layer may be about 12 nm. Other thicknesses may also be useful.

As discussed, the InGaN layer of a B LED has a B bandgap. In one embodiment, an atomic percentage (x) of Indium of the $In_xGa_{1-x}N$ layer of the B MQW is about 15-20%. Providing other atomic percentages of In in the InGaN layer may also be useful.

In one embodiment, a top LED layer 538 is formed on the B MQW. In one embodiment, an EBL (not shown) is formed on the B MQW prior to forming the top LED layer. For example, a top B LED layer is formed on the EBL. The top LED layer, in one embodiment, is a second polarity doped GaN top LED layer, such as a p-GaN layer. The top LED layer may be formed by SEG. Doping the top LED layer may be achieved by in-situ doping during SEG or by ion implantation after formation.

Figure 6E:
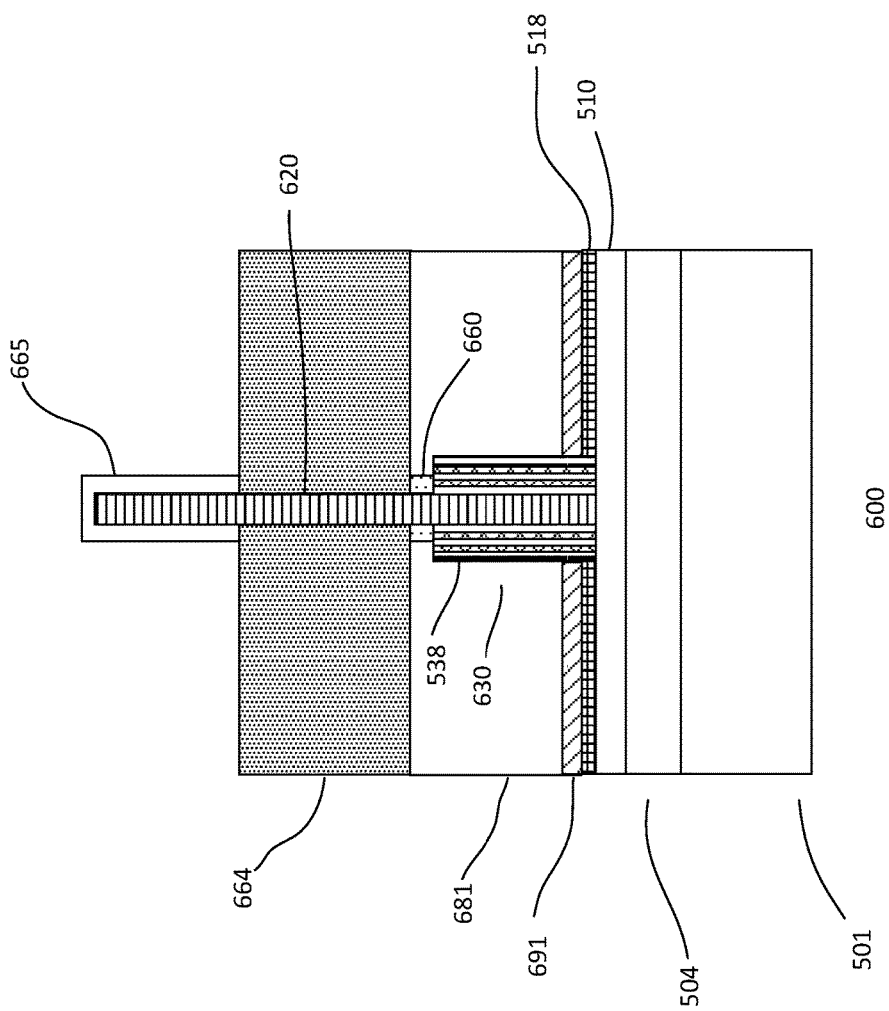

Referring to FIG. 6e, a first metal layer 691 is formed on the substrate. The first metal layer represents M1 of the device. The first metal layer is formed on the mask layer 518. The first metal layer, for example, represents M1 of the device. The first metal layer may be an Al layer. Other types of conductive materials, such TCO, copper or copper alloy, may also be used as the metal layer. The thickness of the metal layer may be about 0.25 um. Other thicknesses may also be useful. The metal layer, as shown, is coupled to the top LED layer of the B LED.

In one embodiment, a metal layer is formed on the substrate. The metal layer may be formed by sputtering. Other techniques for forming the metal layer may also be useful metal layer fills the gaps and covers the B LED. A planarizing process, such as chemical mechanical polish (CMP) may be performed to remove excess metal material and form a planar top surface between the metal layer and top of the B LED. An etch back process, such as a reactive ion etch (RIE), is performed to recess the metal layer to a desired depth. Other types of etch back processes may also be useful. The etch back process is selective to the protective liner and LED layers.

A first interlevel dielectric layer 681 is formed over the first metal layer 691. The first interlevel dielectric layer may be a silicon oxide layer. Other types of interlevel dielectric layers may also be useful. The dielectric layer is formed by, for example, chemical vapor deposition (CVD). Other techniques may also be useful to form the dielectric layer. The dielectric layer fills the gaps and covers the B LED. A CMP may be performed to form a planar top surface between the dielectric layer and top of the B LED. An etch back process, such as RIE, is performed to recess the dielectric layer to a desired depth. The desired depth, for example, is at the interface of the base and intermediate regions of the fin body. For example, the etch back exposes the protective liner in the intermediate and top portion of the fin body.

The protective liner exposed by the first interlevel dielectric layer 681 is removed. The liner may be removed by a wet etch selective to the fin body and the first interlevel dielectric layer. Other etch process, such as RIE, may also be useful. This exposes the intermediate and top portions of the fin body. The first interlevel dielectric layer with spacers 660 from remaining portions of the protective liner remain. The spacers, for example, are SiN spacers A second sacrificial layer 664 is formed on the substrate. The second sacrificial layer fills the gaps over the first interlevel dielectric layer. The second sacrificial layer may be removed selectively to the first interlevel dielectric layer. In one embodiment, the second sacrificial layer is a SiN layer formed by CVD. Other types of sacrificial layers may also be useful. A planarizing process, such as CMP removes excess sacrificial material and forms a planar top surface with the sacrificial layer and a top of the fin body. An etch back process, such as RIE, recesses the sacrificial layer to a desired depth. The desired depth is equal to a top of the intermediate LED.

A second protective liner 665 is formed on the exposed portion of the fin body. The second sacrificial layer can be removed selectively to the second protective layer. For example, the second protective liner is a silicon oxide layer. The second protective liner may be formed by CVD. The liner layer may be patterned using mask and etch techniques to leave the second protective liner lining the exposed portions of the fin body.

Figure 6F:
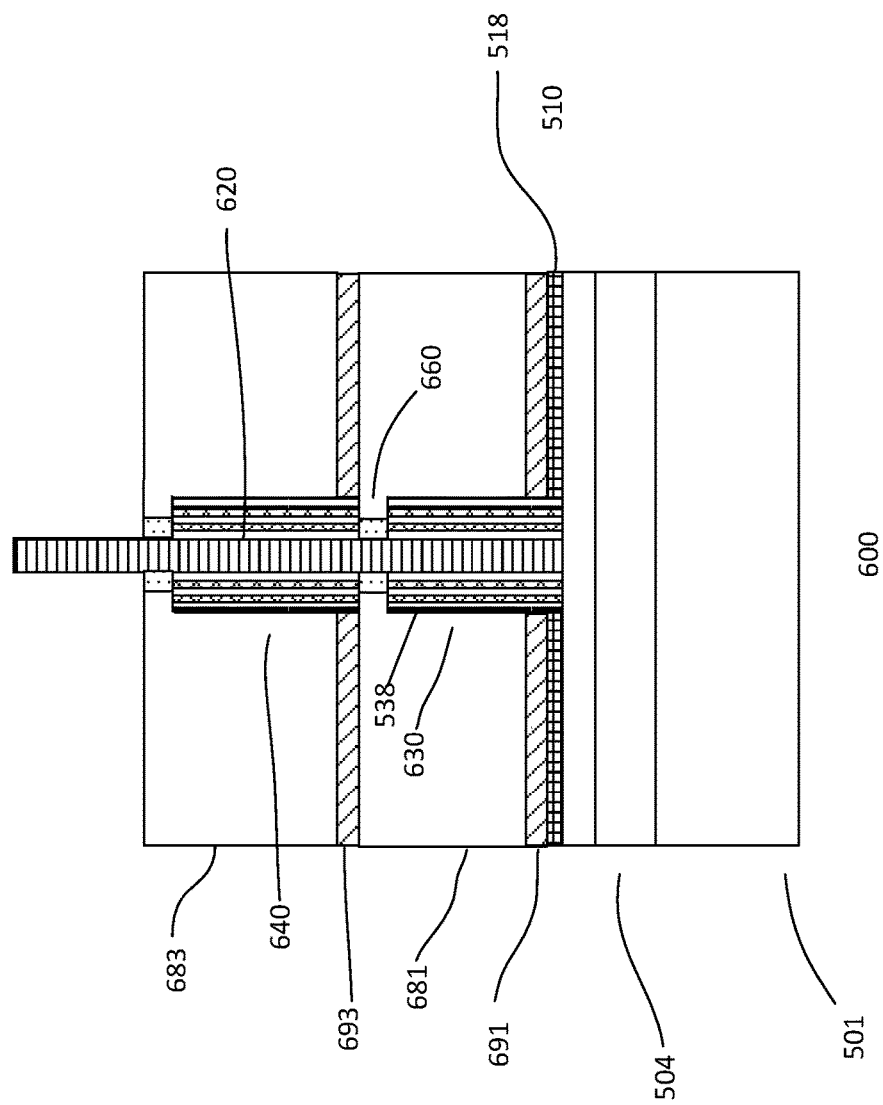

In FIG. 6f, the second sacrificial layer is removed. The second sacrificial layer may be removed selective to the second protective liner, the first interlevel dielectric layer and the fin body. This exposes the intermediate region of the fin body on which the intermediate LED is formed.

In one embodiment, the process continues to form a G LED 640 on the exposed intermediate portion of the fin body. For example, the process commences to forms a G MQW for the G LED, similar to the B MQW. For example, layers of the G MQW are formed by SEG on the exposed portion of the intermediate fin body. A top LED layer is formed on the G MQW by SEG. An EBL (not shown) may be formed on the G MQW prior to forming the top LED layer. As discussed, the InGaN layer of a G LED has a G bandgap. In one embodiment, an atomic percentage (x) of Indium of the $In_xGa_{1-x}N$ layer of the G MQW is about 25-30%. Providing other atomic percentages of In in the InGaN layer may also be useful.

A second metal layer 693 is formed on the top of the first interlevel dielectric layer. The second metal layer represents M2 of the device. The second metal layer may be a TCO layer, such as ITO. The thickness of the metal layer may be about 150 nm. Other thicknesses may also be useful. The metal layer, as shown, is coupled to the top LED layer of the G LED. The second metal layer may be formed in a similar manner as the first metal layer. For example, a metal layer is deposited, polished by CMP and etched back to form the second metal layer on the first interlevel dielectric layer.

A second interlevel dielectric layer 683 is formed over the second metal layer. The second interlevel dielectric layer may be a silicon oxide layer. Other types of interlevel dielectric layers may also be useful. The dielectric layer may be formed similarly to the first interlevel dielectric layer. For example, a dielectric layer is deposited, polished by CMP and etched back to form the second interlevel dielectric layer. The second interlevel dielectric layer may be etched back to the top of the intermediate LED. In the case that both the second interlevel dielectric layer and the second protective liner are the same material, the etch also removes the top portion of the fin body.

In the case that the second protective liner is formed of a different material than the second interlevel dielectric layer, it is removed to expose the top portion of the fin body. A dielectric spacer, such as SiN spacer, may be formed above intermediate LED surrounding the fin body. The dielectric spacer, for example, may be formed by mask and etch techniques. A spacer layer may be formed on the substrate and a patterned photoresist mask may be employed to pattern the spacer layer to leave the spacer surrounding the fin body above the intermediate LED. An interlevel dielectric is formed or the substrate, polished and etched back to a depth of the top of the spacer.

In an alternative embodiment, the second interlevel dielectric layer may be etched back to a depth above the intermediate LED. The depth, for example, is equal to about the separation distance between LEDs. A wet etch may be performed to remove the second protective liner to expose the top portion of the fin body. This leaves a spacer formed by the second protective liner which is protected by the second interlevel dielectric layer. In the case where both the interlevel dielectric layer and the second protective liner are of the same material, such as silicon oxide, the depth which the second interlevel dielectric layer should take into account of etching to remove the second protective liner. For example, the depth of the recess should be less than the desired depth to take into account of additional recessing from the etch to remove the protective liner.

Figure 6G:
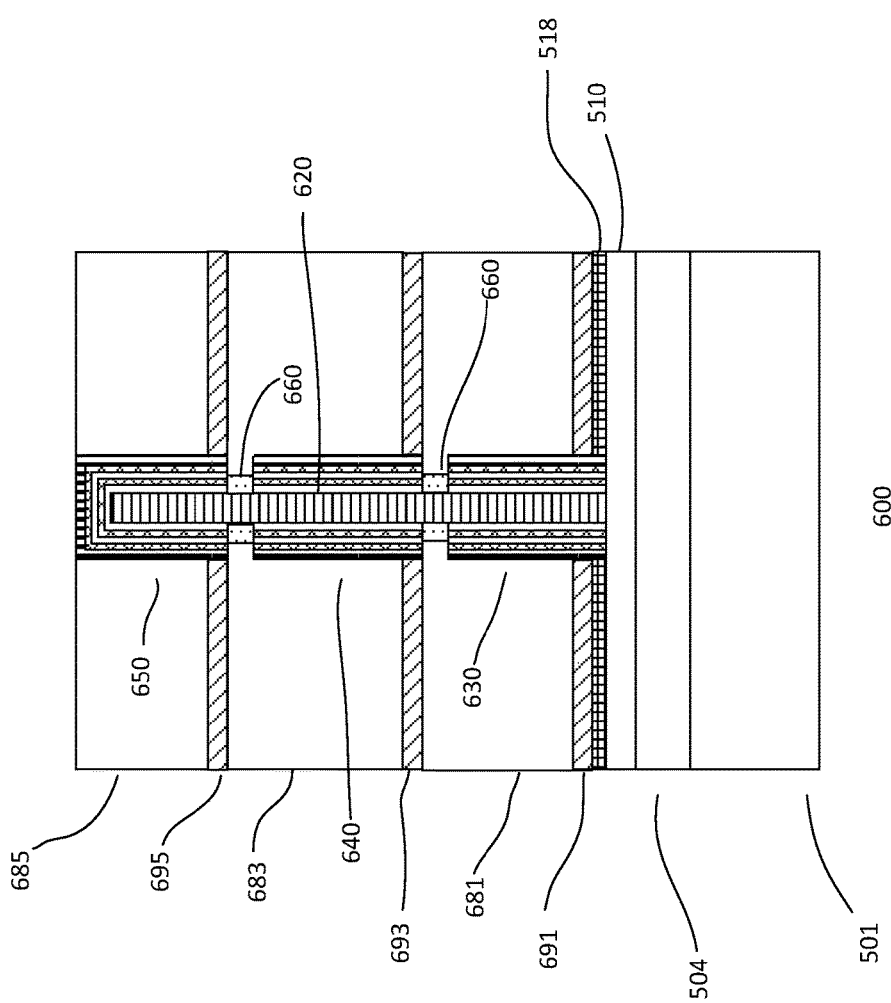

Referring to FIG. 6g, a top LED 650 is formed on exposed top portion of the fin body. In one embodiment, the process continues to form a R LED on the exposed top portion of the fin body. For example, the process commences to forms a R MQW for the R LED. The layers of the R MQW, for example, are formed by SEG on the exposed portion of the fin body. A top LED layer is formed on the R MQW by SEG. An EBL (not shown) may be formed on the G MQW prior to forming the top LED layer. As discussed, the InGaN layer of a R LED has a R bandgap. In one embodiment, an atomic percentage (x) of Indium of the $In_xGa_{1-x}N$ layer of the R MQW is about 35-40%. Providing other atomic percentages of In in the InGaN layer may also be useful.

A third metal layer 695 is formed on the top of the second interlevel dielectric layer 683. The third metal layer represents M3 of the device. The third metal layer may be a TCO layer, such as ITO. The thickness of the metal layer may be about 150 nm. Other thicknesses may also be useful. The metal layer, as shown, is coupled to the top LED layer of the R LED. The third metal layer may be formed in a similar manner as the second metal layer. For example, a metal layer is deposited, polished by CMP and etched back to form the third metal layer on the second interlevel dielectric layer.

A third interlevel dielectric layer 685 is formed over the third metal layer 695. The third interlevel dielectric layer may be a silicon oxide layer. Other types of interlevel dielectric layers may also be useful. The interlevel dielectric layer may be formed similarly to the second interlevel dielectric layer. For example, a dielectric layer is deposited and polished by CMP to provide a planar surface with the top LED.

The process, as described, forms a stacked fin-type multi-color LED with non-overlapping LEDs. The process can be modified to form a stacked nanowire multi-color LED with non-overlapping LEDs. Standard BEOL processes, for example, passivation, are followed to complete the LED chip routing to achieve the desired functionality.

The multicolor LEDs may also be implemented for general lighting applications. For example, the high color rendering index (CRI) white light may be achieved with the multicolor LEDs.

As discussed, the width of the body for different color LEDs may be different. For example, the B LED has the widest width, the G LED has an intermediate width and the R LED has the narrowest width. The body may be processed to provide different portions with different widths. For example, the bottom portions for the B LED may be protected while the upper portions are thinned by, for example, a wet etch. The upper portions are thinned to the desired width of the G LED. Thereafter, the lower portions are protected while the upper portions are further thinned to the desired width for the R LED. Other techniques for processing the body to have different width portions may also be useful.

The present disclosure may be embodied in other specific forms without departing from the spirit or essential characteristics thereof. The foregoing embodiments, therefore, are to be considered in all respects illustrative rather than limiting the invention described herein. The scope of the disclosure is thus indicated by the appended claims, rather than by the foregoing description, and all changes that come within the meaning and range of equivalency of the claims are intended to be embraced therein.

The invention claimed is:

1. A device comprising:
a substrate having a device well; and
a color stacked light emitting diode (LED) pixel disposed on the substrate, the color stacked LED pixel including an LED pixel structure body, a base LED disposed over at least a portion of the LED pixel structure body, an intermediate LED disposed over the base LED, and a top LED disposed over the intermediate LED,
wherein the LED pixel structure body serves as a cathode terminal for the base LED, and the LED pixel structure body is a fin body or a nanowire body.

2. The device of claim 1 wherein the base LED, the intermediate LED, and the top LED further comprises a base multiple quantum well (MQW), an intermediate MQW, and a top MQW respectively, the MQWs comprises at least an $In_xGa_{x-1}N$ layer and a GaN layer, where x is the atomic percentage of In in the $In_xGa_{x-1}N$ layer, and the MQWs have different bandgaps by varying x of the $In_xGa_{x-1}N$ layer in the base LED, the intermediate LED, and the top LED.

3. The device of the claim 1 wherein the color stacked LED pixel is an overlapping stacked LED pixel in which the base LED overlaps with at least a portion of the LED pixel structure body, the intermediate LED overlaps with at least a portion of the base LED, and the top LED overlaps with at least a portion of the intermediate LED.

4. The device of the claim 3 wherein the base LED is a blue LED, the intermediate LED is a green LED, and the top LED is a red LED.

5. The device of the claim 1 wherein the color stacked LED pixel is a non-overlapping stacked LED in which the base LED is disposed over a base portion of the LED pixel structure body, the intermediate LED is disposed over an intermediate portion of the LED pixel structure body, the top LED is disposed over a top portion of the LED pixel structure body, and the base LED, the intermediate LED, and the top LED are separated from each other.

6. The device of the claim 5 wherein the base LED is a blue LED, the intermediate LED is a green LED, and the top LED is a red LED.

7. A device comprising:
a substrate having a device well;
a color stacked light emitting diode (LED) pixel disposed on the substrate, the color stacked LED pixel including an LED pixel structure body, a base LED disposed over at least a portion of the LED pixel structure body, an intermediate LED disposed over the base LED, and a top LED disposed over the intermediate LED,
wherein the base LED has a cathode terminal coupled to the device well and an anode terminal coupled to a first metal level, the intermediate LED has a cathode terminal coupled to a second metal level and an anode terminal coupled to the first metal level, and the top LED has a cathode terminal coupled to the second metal level and an anode terminal coupled to a third metal level.

8. The device of claim 7 wherein the base LED further includes a base LED top layer serving as an anode terminal for the intermediate LED, and the top LED further includes a top LED base layer serving as a cathode terminal of the intermediate LED and the top LED.

9. A method of forming a device, comprising:
providing a substrate having a device well; and
forming a color stacked light emitting diode (LED) pixel disposed on the substrate, the color stacked LED pixel comprises an LED pixel structure body, a base LED disposed over at least a portion of the LED pixel structure body, an intermediate LED disposed over the base LED, and a top LED disposed over the intermediate LED,
wherein the LED pixel structure body serves as a cathode terminal for the base LED, and the LED pixel structure body is a fin body or a nanowire body.

10. The method of claim 9 wherein the base LED, the intermediate LED and the top LED further comprise a base multiple quantum well (MQW), an intermediate MQW, and a top MQW respectively, the MQWs comprise at least an $In_xGa_{x-1}N$ layer and a GaN layer, where x is the atomic percentage of In in the $In_xGa_{x-1}N$ layer, and the MQWs have different bandgaps by varying x of the $In_xGa_{x-1}N$ layer in the base LED, the intermediate LED, and the top LED.

11. The method of claim 9 wherein the color stacked LED pixel is an overlapping stacked LED pixel, wherein the base LED overlaps with at least a portion of the LED pixel structure body, the intermediate LED overlaps with at least a portion of the base LED, and the top LED overlaps with at least a portion of the intermediate LED.

12. The method of claim 11 wherein the base LED is a blue LED, the intermediate LED is a green LED, and the top LED is a red LED.

13. The method of claim 9 wherein the color stacked LED pixel is a non-overlapping stacked LED pixel, wherein the base LED is disposed over a base portion of the LED pixel structure body, the intermediate LED is disposed over an intermediate portion of the LED pixel structure body, the top LED disposed over a top portion of the LED pixel structure body, and the base LED, the intermediate LED, and the top LED are separated from each other.

14. The method of claim 13 wherein the base LED is a blue LED, the intermediate LED is a green LED, and the top LED is a red LED.

15. A method of forming a device, comprising:
providing a substrate having a device well; and
forming a color stacked light emitting diode (LED) pixel disposed on the substrate, the color stacked LED pixel comprises an LED pixel structure body, a base LED disposed over at least a portion of the LED pixel structure body, an intermediate LED disposed over the base LED, and a top LED disposed over the intermediate LED, wherein the base LED has a cathode terminal coupled to the device well and an anode terminal coupled to a first metal level, the intermediate LED has a cathode terminal coupled to a second metal level and an anode terminal coupled to the first metal level, and the top LED has a cathode terminal coupled to the second metal level and an anode terminal coupled to a third metal level.

16. The method of claim 15 wherein the base LED further includes a base LED top layer serving as an anode terminal for the intermediate LED, and the top LED further includes a top LED base layer serving as a cathode terminal of the intermediate LED and the top LED.

* * * * *